US012119371B2

(12) United States Patent
Ohtorii et al.

(10) Patent No.: US 12,119,371 B2
(45) Date of Patent: Oct. 15, 2024

(54) LIGHT SOURCE APPARATUS

(71) Applicants: SONY GROUP CORPORATION, Tokyo (JP); SONY SEMICONDUCTOR SOLUTIONS CORPORATION, Kanagawa (JP)

(72) Inventors: Hiizu Ohtorii, Kanagawa (JP); Hiroshi Morita, Tokyo (JP); Yusuke Oyama, Tokyo (JP); Eiji Otani, Kanagawa (JP); Ken Kikuchi, Tokyo (JP)

(73) Assignees: SONY SEMICONDUCTOR SOLUTIONS CORPORATION, Kanagawa (JP); SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 17/754,825

(22) PCT Filed: Oct. 22, 2020

(86) PCT No.: PCT/JP2020/039703
§ 371 (c)(1),
(2) Date: Apr. 13, 2022

(87) PCT Pub. No.: WO2021/079929
PCT Pub. Date: Apr. 29, 2021

(65) Prior Publication Data
US 2024/0105758 A1 Mar. 28, 2024

(30) Foreign Application Priority Data
Oct. 23, 2019 (JP) .................. 2019-192611

(51) Int. Cl.
*H01L 27/15* (2006.01)
*H01L 33/58* (2010.01)
(Continued)

(52) U.S. Cl.
CPC ............ *H01L 27/156* (2013.01); *H01L 33/58* (2013.01); *H01L 33/64* (2013.01); *H05K 1/028* (2013.01);
(Continued)

(58) Field of Classification Search
CPC ......... H01L 33/58; H01L 33/64; H05K 1/028; H05K 1/0281; H05K 1/189
See application file for complete search history.

(56) References Cited

U.S. PATENT DOCUMENTS

| 5,828,683 A | 10/1998 | Freitas | |
|---|---|---|---|
| 2012/0138974 A1* | 6/2012 | Yoo | H01L 33/64 257/88 |

(Continued)

FOREIGN PATENT DOCUMENTS

| CA | 2833435 A1 | 11/2012 |
|---|---|---|
| CN | 103502841 A | 1/2014 |

(Continued)

OTHER PUBLICATIONS

"MIPTEC 3D Implementation Device", Panasonic Industry, technology introduction, URL: https://www3.panasonic.biz/ac/j/tech/mid/miptec/index.jsp, Aug. 24, 2020, 02 pages.

(Continued)

*Primary Examiner* — Nathan Milakovich
(74) *Attorney, Agent, or Firm* — CHIP LAW GROUP

(57) ABSTRACT

The present technology relates to a light source apparatus that makes it possible to provide a widely applicable light source apparatus. A light source apparatus includes a transmissive board that transmits light emitted by a light-emitting element, a circuit board that drives the light-emitting element and is joined to the transmissive board, and a light-emitting board that has the light-emitting element and is connected to the circuit board via a first bump. Further, in the (Continued)

light source apparatus, the circuit board and an organic board are configured to be connected by sandwiching the light-emitting board via second bumps. The present technology can be applied to a light source apparatus that emits light.

23 Claims, 28 Drawing Sheets

(51) Int. Cl.
  *H01L 33/64* (2010.01)
  *H05K 1/02* (2006.01)
  *H05K 1/18* (2006.01)
(52) U.S. Cl.
  CPC ........... *H05K 1/0281* (2013.01); *H05K 1/189* (2013.01); *H05K 2201/10121* (2013.01); *H05K 2201/10151* (2013.01)

(56) References Cited

U.S. PATENT DOCUMENTS

| | | | |
|---|---|---|---|
| 2012/0287417 | A1 | 11/2012 | Mimeault |
| 2015/0078711 | A1* | 3/2015 | Ootorii ................ G02B 6/4214 385/88 |
| 2015/0282295 | A1 | 10/2015 | Matsumoto |
| 2017/0068056 | A1 | 3/2017 | Gappa |
| 2017/0170339 | A1* | 6/2017 | Ootorii ............ H04B 10/25891 |
| 2019/0357352 | A1 | 11/2019 | Rothenhaeusler |
| 2021/0156965 | A1* | 5/2021 | Oyama .................. H01L 25/16 |
| 2024/0107677 | A1* | 3/2024 | Ohtorii .................. H01S 5/183 |

FOREIGN PATENT DOCUMENTS

| | | |
|---|---|---|
| CN | 104459905 A | 3/2015 |
| CN | 106256055 A | 12/2016 |
| CN | 110178451 A | 8/2019 |
| EP | 2461380 A2 | 6/2012 |
| JP | H0837397 A | 2/1996 |
| JP | 2008130610 A | 6/2008 |
| JP | 2010-062456 A | 3/2010 |
| JP | 2012-124485 A | 6/2012 |
| JP | 2014-517921 A | 7/2014 |
| JP | 2015-060097 A | 3/2015 |
| JP | 2017050470 A | 3/2017 |
| JP | 2018-119986 A | 8/2018 |
| JP | 2020506537 A | 2/2020 |
| KR | 10-2012-0062303 A | 6/2012 |
| KR | 10-2015-0032623 A | 3/2015 |
| KR | 20190104539 A | 9/2019 |
| WO | 2012/153309 A2 | 11/2012 |
| WO | 2015/174239 A1 | 11/2015 |
| WO | WO-2018133893 A1 | 7/2018 |

OTHER PUBLICATIONS

"Panasonic develops telescopic stretchable resin film—providing insulating materials, transparent electrode materials, and conductive pastes for wiring" Panasonic Holdings Corporation, URL: https://news.panasonic.com/jp/topics/141979.html, Dec. 25, 2015, 02 pages.

International Search Report and Written Opinion of PCT Application No. PCT/JP2020/039703, issued on Dec. 28, 2020, 11 pages of ISRWO.

* cited by examiner

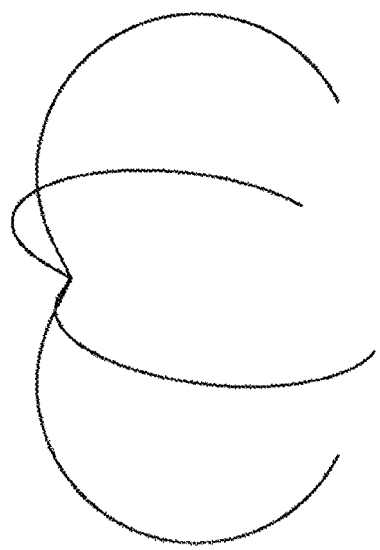
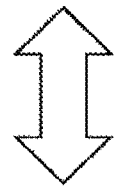
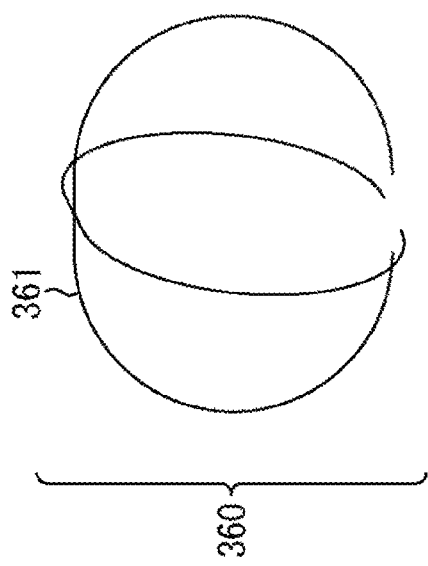
FIG. 27

LIGHT SOURCE APPARATUS

CROSS REFERENCE TO RELATED APPLICATIONS

This application is a U.S. National Phase of International Patent Application No. PCT/JP2020/039703 filed on Oct. 22, 2020, which claims priority benefit of Japanese Patent Application No. JP 2019-192611 filed in the Japan Patent Office on Oct. 23, 2019. Each of the above-referenced applications is hereby incorporated herein by reference in its entirety.

TECHNICAL FIELD

The present technology relates to a light source apparatus, and in particular relates to a light source apparatus that makes it possible to provide a widely applicable light source apparatus, for example.

BACKGROUND ART

In recent years, as one of sensing technologies for realizing automatic driving, the LiDAR technology is seen as an important technology. LiDAR irradiates a wide range with a beam emitted by one light source such as a laser, by using a diffuser, or by performing vertical and horizontal scanning by using a galvano mirror. Then, the LiDAR measures the distance to a target object on the basis of the length of time that elapses until reflection light of the beam returns. A method of irradiating a wide range with a beam by using a diffuser is described in PTL 1.

A scanning manner of performing scanning with a beam by using a galvano mirror requires an expensive galvano mirror and is prone to experience malfunctions. In methods that use a diffuser, it is difficult to increase the light amount of a beam with which a wide range is irradiated, because it is required to satisfy the requirements regarding Class 1M of laser safety standards.

CITATION LIST

Patent Literature

[PTL 1]
Japanese Patent Laid-Open No. 2018-119986

SUMMARY

Technical Problem

Regarding light source apparatuses that emit light, there is a demand for proposals about variously applicable light source apparatuses, in addition to a demand for proposals about light source apparatuses that can be used in LiDAR.

The present technology has been made in view of such a situation and makes it possible to provide a widely applicable light source apparatus.

Solution to Problem

A light source apparatus of the present technology is a light source apparatus including a transmissive board that transmits light emitted by a light-emitting element, a circuit board that drives the light-emitting element and is joined to the transmissive board, and a light-emitting board that has the light-emitting element and is connected to the circuit board via a first bump, in which the circuit board and an organic board are configured to be connected by sandwiching the light-emitting board via a second bump.

In the light source apparatus of the present technology, the circuit board that drives the light-emitting element is joined to the transmissive board that transmits light emitted by the light-emitting element, and the light-emitting board that has the light-emitting element is connected to the circuit board via the first bump. Then, the circuit board and the organic board are connected by sandwiching the light-emitting board via the second bump.

BRIEF DESCRIPTION OF DRAWINGS

FIG. 27 is a perspective view depicting an overview of a seventh configuration example of a light source module to which the light source chips 10 are applied.

DESCRIPTION OF EMBODIMENTS

<First Configuration Example of Light Source Chip 10>

Figure 1:
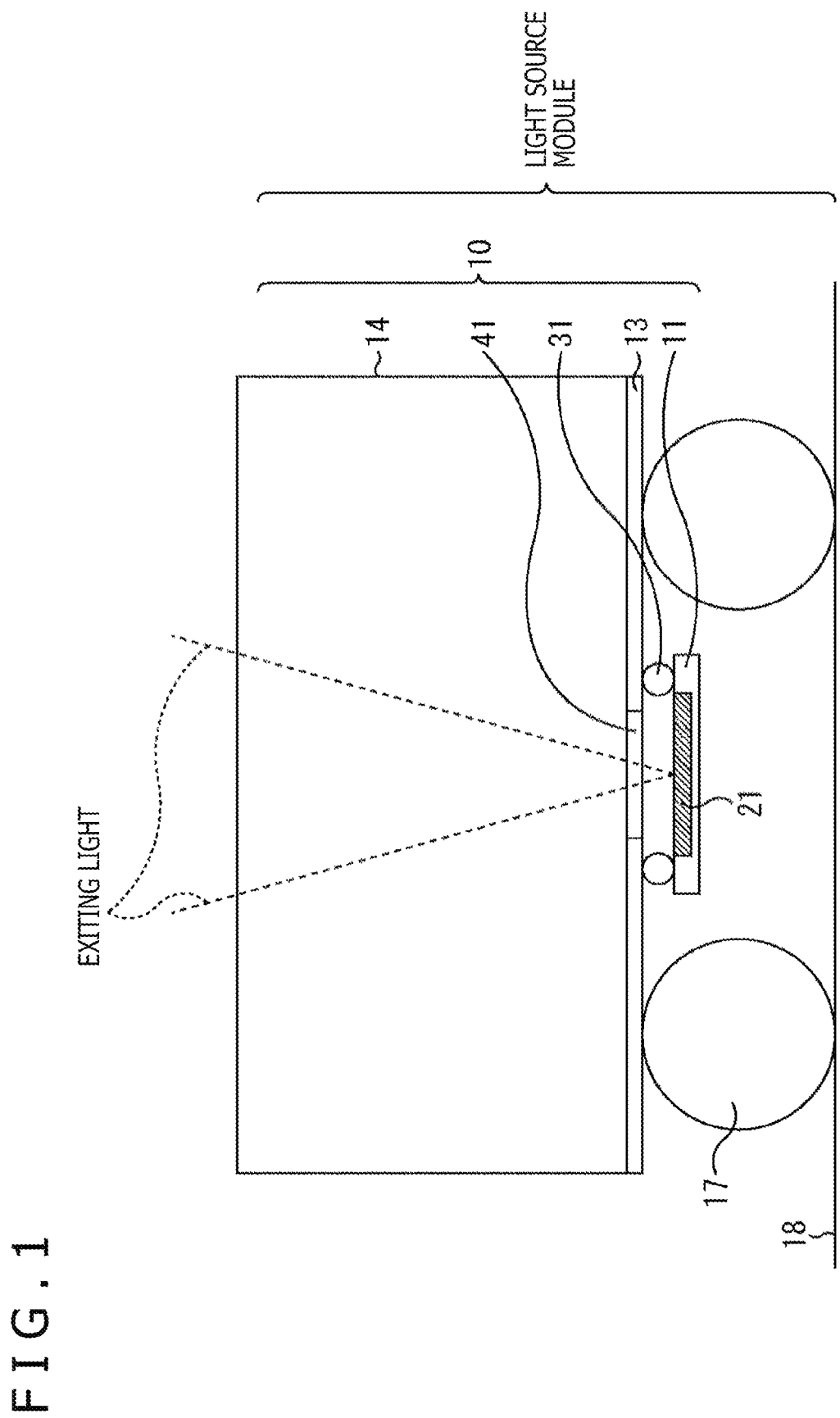
FIG. 1 is a cross-sectional view depicting a first configuration example of a light source chip 10 to which the present technology is applied.

FIG. 1 is a cross-sectional view depicting a first configuration example of a light source chip 10 to which the present technology is applied.

Figure 2:
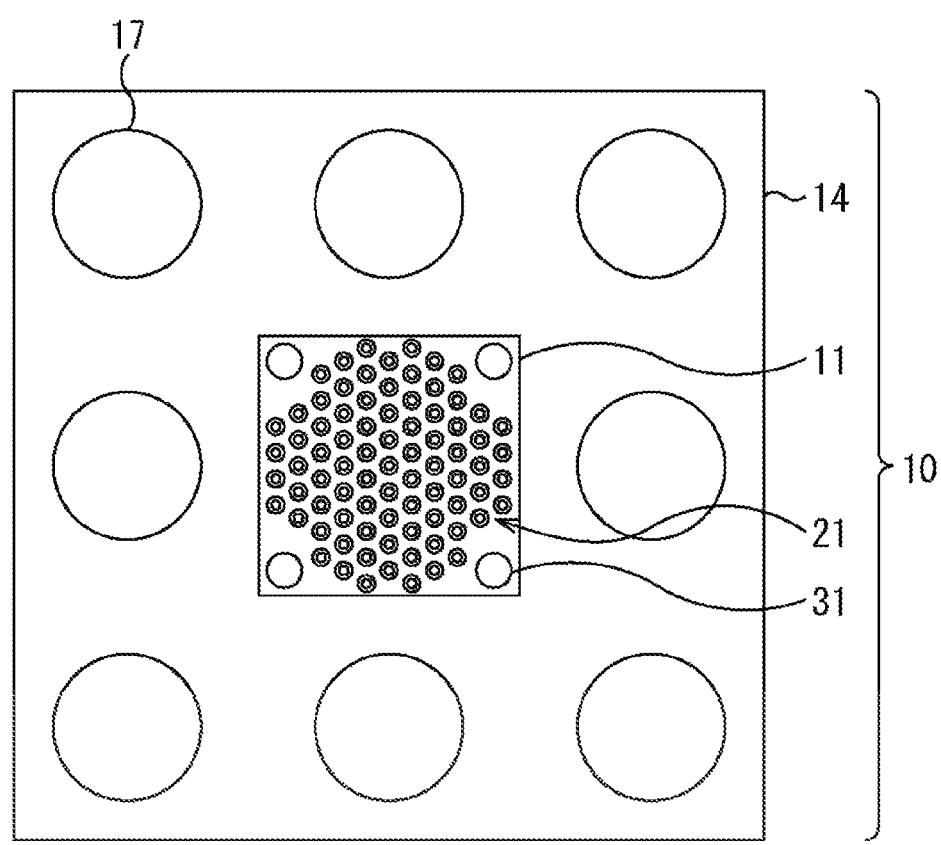
FIG. 2 is a plan view depicting the first configuration example of the light source chip 10 to which the present technology is applied.

FIG. 2 is a plan view (top view) depicting the first configuration example of the light source chip 10.

Note that the light source chip 10 is depicted in FIG. 2 such that the inside of the light source chip 10 can be seen.

The light source chip 10 includes a light-emitting board 11, a circuit board 13, and a transmissive board 14, and has what is called a discrete integrated light source structure.

The light-emitting board 11 includes a light-emitting element 21 that emits light. The light-emitting element 21 includes, for example, a vertical cavity surface emitting laser (VCSEL, Vertical Cavity Surface Emitting LASER), and emits light with a wavelength of, for example, 905 nm (nano meters) at a pulse width of, for example, 6 ns (nano seconds).

For example, the circuit board 13 includes Si or GaAs, and the circuit board 13 has formed thereon various types of circuits that drive the light-emitting element 21.

The circuit board 13 has formed thereon various types of circuits that drive the light-emitting element 21 such as a light emission control section (LDD: laser diode driver), a serializer, or a deserializer which are not depicted, and the circuit board 13 drives the light-emitting element 21 and causes light to be emitted.

The transmissive board 14 transmits light emitted by the light-emitting element 21. The transmissive board 14 includes, for example, quartz. Note that the transmissive board 14 can include any material that transmits (the wavelength of) light emitted by the light-emitting element 21. For example, in a case that the light-emitting element 21 emits infrared light, the transmissive board 14 can include, for example, Si that transmits infrared light.

In the light source chip 10, the light-emitting board 11 is electrically connected to the circuit board 13 via first bumps (solder bumps) 31. The light-emitting board 11 is connected to the circuit board 13 such that light emitted by the light-emitting element 21 exits toward the circuit board 13. As depicted in FIG. 2, in the present embodiment, the light-emitting board 11 is connected to the circuit board 13 by four first bumps 31.

The circuit board 13 and the transmissive board 14 are joined, for example, by adhering to each other using an adhesive or the like.

In the present embodiment, a portion that is in the circuit board 13 and corresponds to the light-emitting element 21 (a portion to be irradiated with light emitted by the light-emitting element 21) is open, and an opening 41 is formed there. The opening 41 can be formed by, for example, dry etching or the like. Light emitted by the light-emitting element 21 enters the transmissive board 14 through the opening 41, is transmitted through, and exits from the transmissive board 14.

The light source chip 10 is configured such that the optical axis of (light emitted by) the light-emitting element 21 and the central axis of the opening 41 are arranged approximately coaxially.

Note that, in a case that the circuit board 13 includes a material that transmits light emitted by the light-emitting element 21 (a highly transmissive material), the circuit board 13 can be configured without the opening 41 being provided therethrough.

For example, the adoptable specifications of the light source chip 10 includes the light-emitting board 11: 50 μm (micro meters) thickness and 700 μm length of each side, the circuit board 13: 30 to 100 μm thickness, the transmissive board 14: 750 μm thickness and 1.3 mm (millimeters) length of each side, and the like. In this case, the size of the light source chip 10 as seen in a plan view (as seen from above) has a length of each side which is, for example, 1.3 mm. Here, for example, 60 W or the like can be adopted as the peak power of the light source chip 10.

The thus-configured light source chip 10 is included in a light source module by being mounted on a flexible board 18 as an organic board having, for example, two to four layers. The mounting of the light source chip 10 on the flexible board 18 can be performed by, for example, electrically connecting the circuit board 13 and the flexible board 18 via second bumps 17 such that the light-emitting board 11 is sandwiched therebetween.

As depicted in FIG. 2, in the present embodiment, the light source chip 10 is connected to the flexible board 18 via eight second bumps 17. The size of the second bumps 17 is, for example, φφ 200 μm. In this case, the height (thickness) of the light source chip 10 including the second bumps 17 is approximately, for example, 0.84 mm.

Note that the light-emitting element 21 may include a typical high-output-power edge-emitting LD. However, in a case that it is difficult in terms of the structure to arrange an edge-emitting LD, a surface-emitting VCSEL can be applied as the light-emitting element 21. As a VCSEL, a front-side light-emitting type can be applied.

Figure 3:
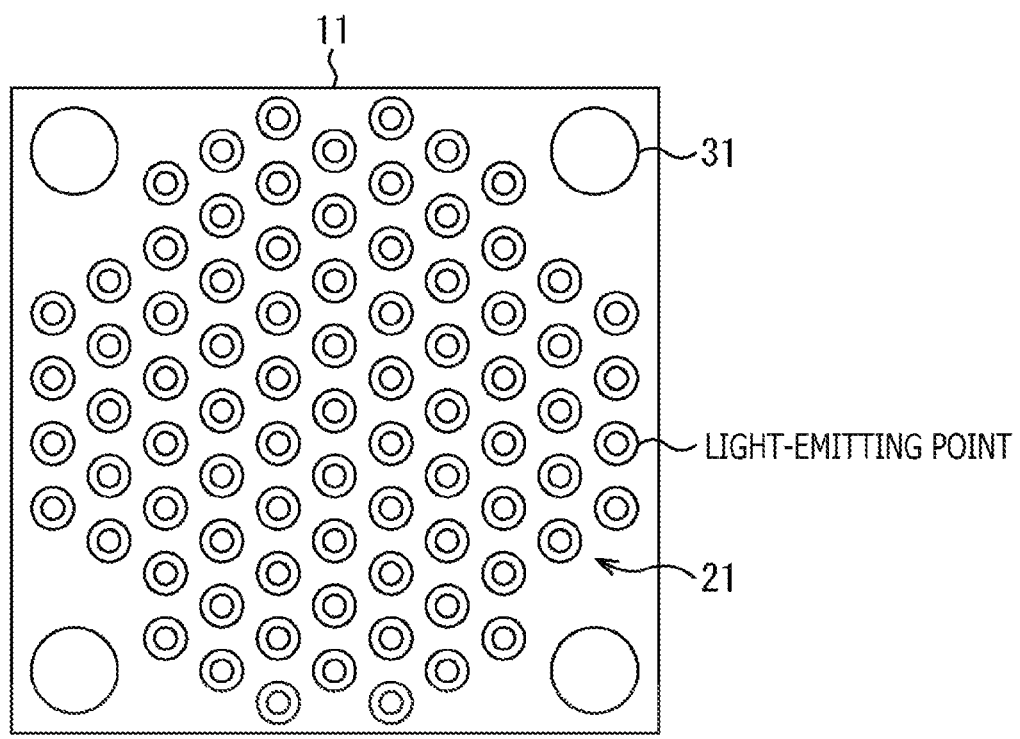
FIG. 3 is a plan view depicting a configuration example of a light-emitting board 11.

FIG. 3 is a plan view depicting a configuration example of the light-emitting board 11.

(The light-emitting element 21 of) the light-emitting board 11 has one or a plurality of light-emitting points. A light-emitting point has a mesa structure with a size of, for example, φ 10 μm. Laser beams as light exit from the light-emitting points toward the nearer side of the figure. Note that, by contriving the mounting, the light-emitting board 11 can configure the light source chip 10 even if the light-emitting board 11 is a backside-emitting board that emits laser beams toward the back side of the figure.

For example, φ 40 μm can be adopted as the size of the first bumps 31 that connect the light-emitting board 11 to the circuit board 13.

In addition, whereas the light-emitting board 11 has a plurality of light-emitting points in FIG. 3, the number of light-emitting points may be one.

Furthermore, in a case that a plurality of light-emitting points is provided in the light-emitting board 11, the plurality of light-emitting points can be provided at a pitch of, for example, 20 to 40 μm.

In addition, for example, 100 or 400 can be adopted as the number of light-emitting points. In a case that 400 light-emitting points are provided in the light-emitting board 11, the size of the light-emitting board 11 is approximately, for example, 700 μm in terms of the length of each side, as explained with reference to FIG. 1 and FIG. 2. In this case, the light-emitting board 11 can be regarded as a surface light source with a size which is approximately 700 μm in terms of the length of each side. In a case that 100 light-emitting points are provided in the light-emitting board 11, the size of the light-emitting board 11 is approximately, for example, 350 μm in terms of the length of each side. In this case, the light-emitting board 11 can be regarded as a surface light source with a size which is approximately 350 μm in terms of the length of each side.

<Second Configuration Example of Light Source Chip>

Figure 4:
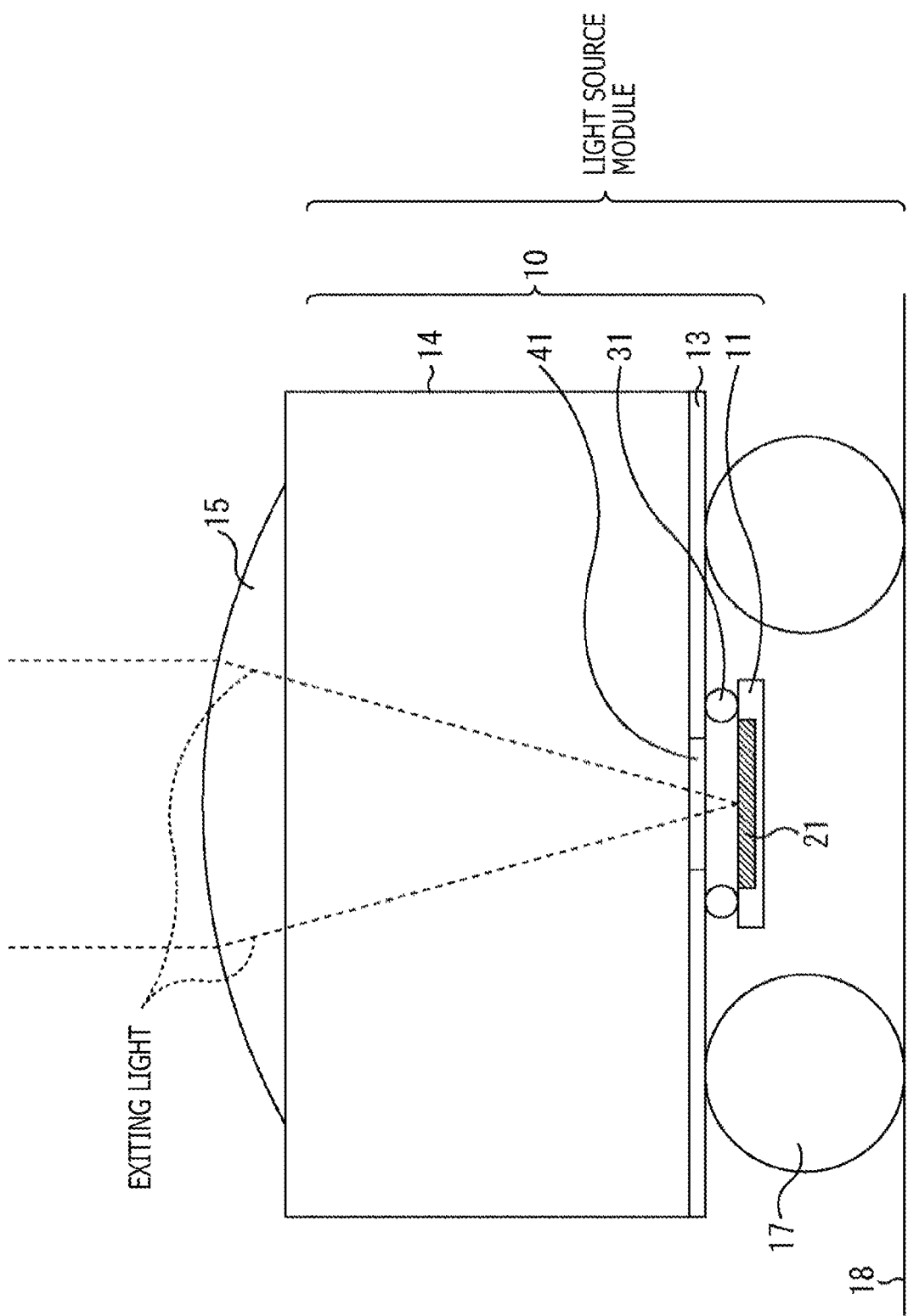
FIG. 4 is a cross-sectional view depicting a second configuration example of the light source chip 10.

FIG. 4 is a cross-sectional view depicting a second configuration example of the light source chip 10.

Note that portions in the figure that have counterparts in the cases of FIG. 1 and FIG. 2 are given identical reference characters, and explanations thereof are omitted as appropriate below.

In FIG. 4, the light source chip 10 includes the light-emitting board 11, the circuit board 13, the transmissive board 14, and a lens 15.

Accordingly, the light source chip 10 in FIG. 4 is the same as in the cases of FIG. 1 and FIG. 2 in that the light source chip 10 has the light-emitting board 11, the circuit board 13, and the transmissive board 14. However, the light source chip 10 in FIG. 4 is different from the light source chip 10 in the cases of FIG. 1 and FIG. 2 in that the lens 15 is provided additionally.

In FIG. 4, the lens 15 is provided on a side opposite to the light-emitting-board-11 side of the transmissive board 14.

The lens 15 includes, for example, resin, acrylic, quartz, or the like, and is a collimate lens that converts light emitted by the light-emitting board 11 into (approximately) collimated light, for example, exiting light which is diffused light that spreads at 0.5 degrees.

The light source chip 10 is configured such that the optical axis of the lens 15, the optical axis of the light-emitting element 21, and the central axis of the opening 41 are arranged approximately coaxially.

<Third Configuration Example of Light Source Chip>

Figure 5:
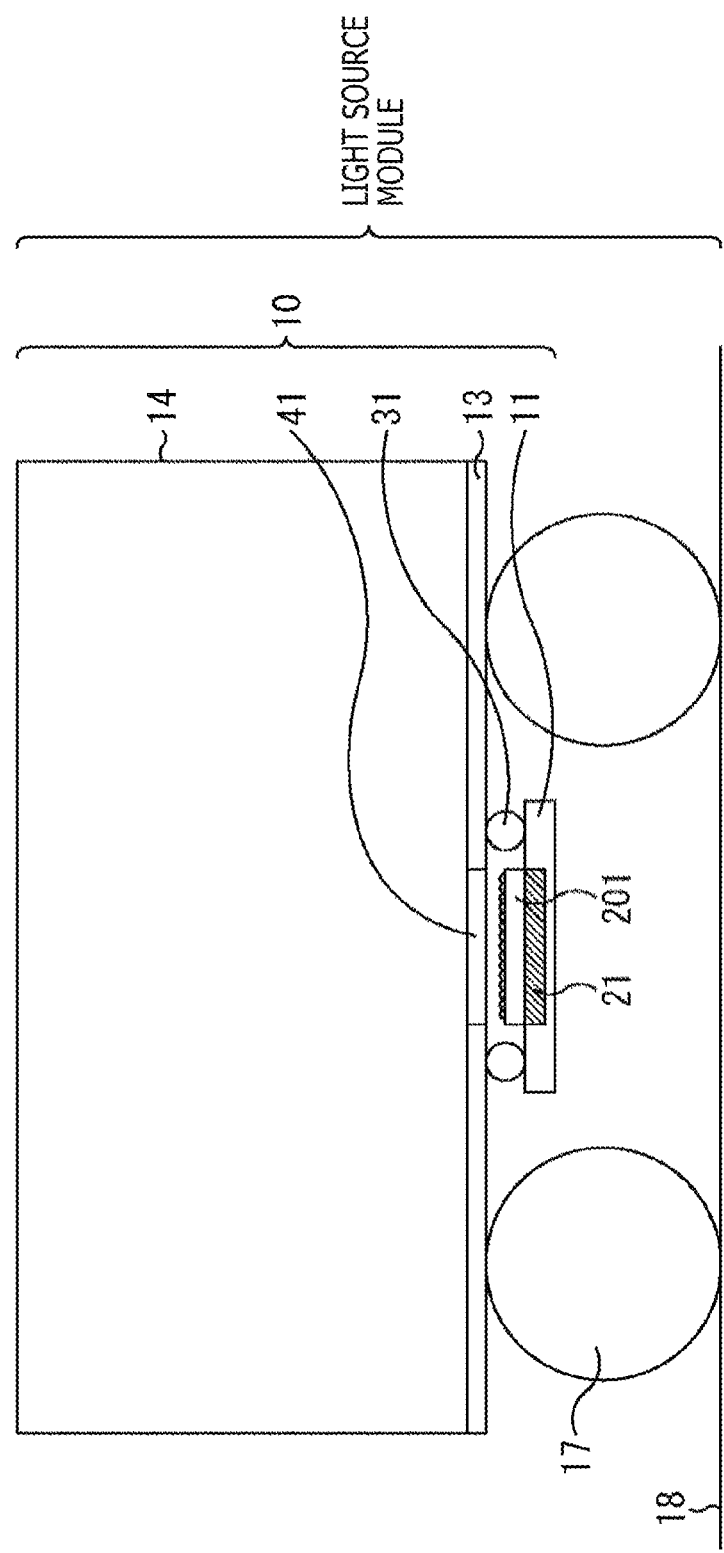
FIG. 5 is a cross-sectional view depicting a third configuration example of the light source chip 10.

FIG. 5 is a cross-sectional view depicting a third configuration example of the light source chip 10.

Note that portions in the figure that have counterparts in the cases of FIG. 1 and FIG. 2 are given identical reference characters, and explanations thereof are omitted as appropriate below.

In FIG. 5, the light source chip 10 includes the light-emitting board 11, the circuit board 13, the transmissive board 14, and a lens array 201.

Accordingly, the light source chip 10 in FIG. 5 is the same as in the cases of FIG. 1 and FIG. 2 in that the light source chip 10 has the light-emitting board 11, the circuit board 13, and the transmissive board 14. However, the light source chip 10 in FIG. 5 is different from the light source chip 10 in the cases of FIG. 1 and FIG. 2 in that the lens array 201 is provided additionally.

The lens array 201 is provided on the light-emitting-board-11 side of the transmissive board 14. In FIG. 5, the lens array 201 is provided such that the lens array 201 directly contacts the light-emitting element 21 of the light-emitting board 11.

The lens array 201 includes, for example, microlenses similar to the lens 15 that are arranged on a flat plate similarly to the light-emitting points (FIG. 3) of the light-emitting board 11. Accordingly, the lens array 201 is provided with microlenses each for a light-emitting point of the light-emitting board 11.

The lens array 201 is provided on the light-emitting element 21 of the light-emitting board 11 such that the optical axes of (light emitted by) the light-emitting points of the light-emitting board 11 and the optical axes of the microlenses corresponding to the light-emitting points are arranged approximately coaxially.

In addition, the lens array 201 can be provided such that the microlenses provided on the flat plate are arranged on a side (the upper side in the figure) from which light from the light-emitting board 11 exits.

<Fourth Configuration Example of Light Source Chip>

Figure 6:
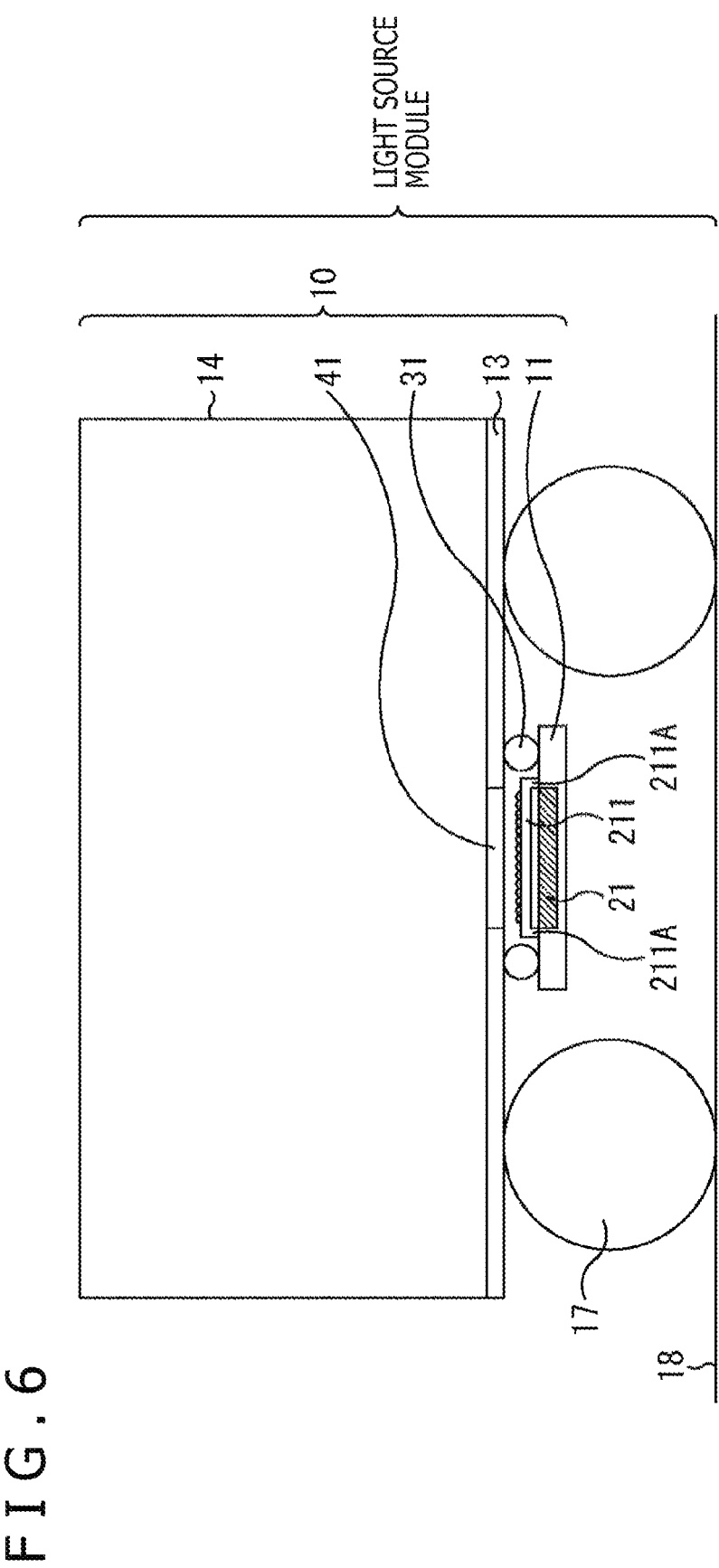
FIG. 6 is a cross-sectional view depicting a fourth configuration example of the light source chip 10.

FIG. 6 is a cross-sectional view depicting a fourth configuration example of the light source chip 10.

Note that portions in the figure that have counterparts in the cases of FIG. 1 and FIG. 2 are given identical reference characters, and explanations thereof are omitted as appropriate below.

In FIG. 6, the light source chip 10 includes the light-emitting board 11, the circuit board 13, the transmissive board 14, and a lens array 211.

Accordingly, the light source chip 10 in FIG. 6 is the same as in the cases of FIG. 1 and FIG. 2 in that the light source chip 10 has the light-emitting board 11, the circuit board 13, and the transmissive board 14. However, the light source chip 10 in FIG. 6 is different from the light source chip 10 in the cases of FIG. 1 and FIG. 2 in that the lens array 211 is provided additionally.

Similarly to the lens array 201 in FIG. 5, the lens array 211 is provided on the light-emitting-board-11 side of the transmissive board 14.

Similarly to the lens array 201, the lens array 211 includes microlenses similar to the lens 15 that are arranged similarly to the light-emitting points of the light-emitting board 11.

Similarly to the lens array 201, the lens array 211 is provided on the light-emitting board 11 such that the optical axes of the light-emitting points of the light-emitting board 11 and the optical axes of the microlenses corresponding to the light-emitting points are arranged approximately coaxially.

It should be noted that the lens array 211 has, on the circumference (outer side), protrusions as leg portions 211A protruding in the optical axis direction of the microlenses, and is arranged on the light-emitting board 11 such that the leg portions 211A contact the light-emitting board 11. Thereby, the lens array 211 is supported on the light-emitting board 11 by the leg portions 211A.

Accordingly, in FIG. 6, a space (gap) is formed between the lens array 211 and the light-emitting element 21 of the light-emitting board 11, and the lens array 211 does not directly contact the light-emitting element 21 of the light-emitting board 11.

In this case, the stress of the lens array 211 can be prevented from being applied directly to the light-emitting element 21 of the light-emitting board 11.

For example, 10 to 50 µm can be adopted as the distance between the light-emitting element 21 of the light-emitting board 11 and the lenses of the lens array 211.

Note that, similarly to the lens array 201, the lens array 211 can be provided such that the microlenses provided on a flat plate are arranged on a side from which light from the light-emitting board 11 exits.

<Fifth Configuration Example of Light Source Chip>

Figure 7:
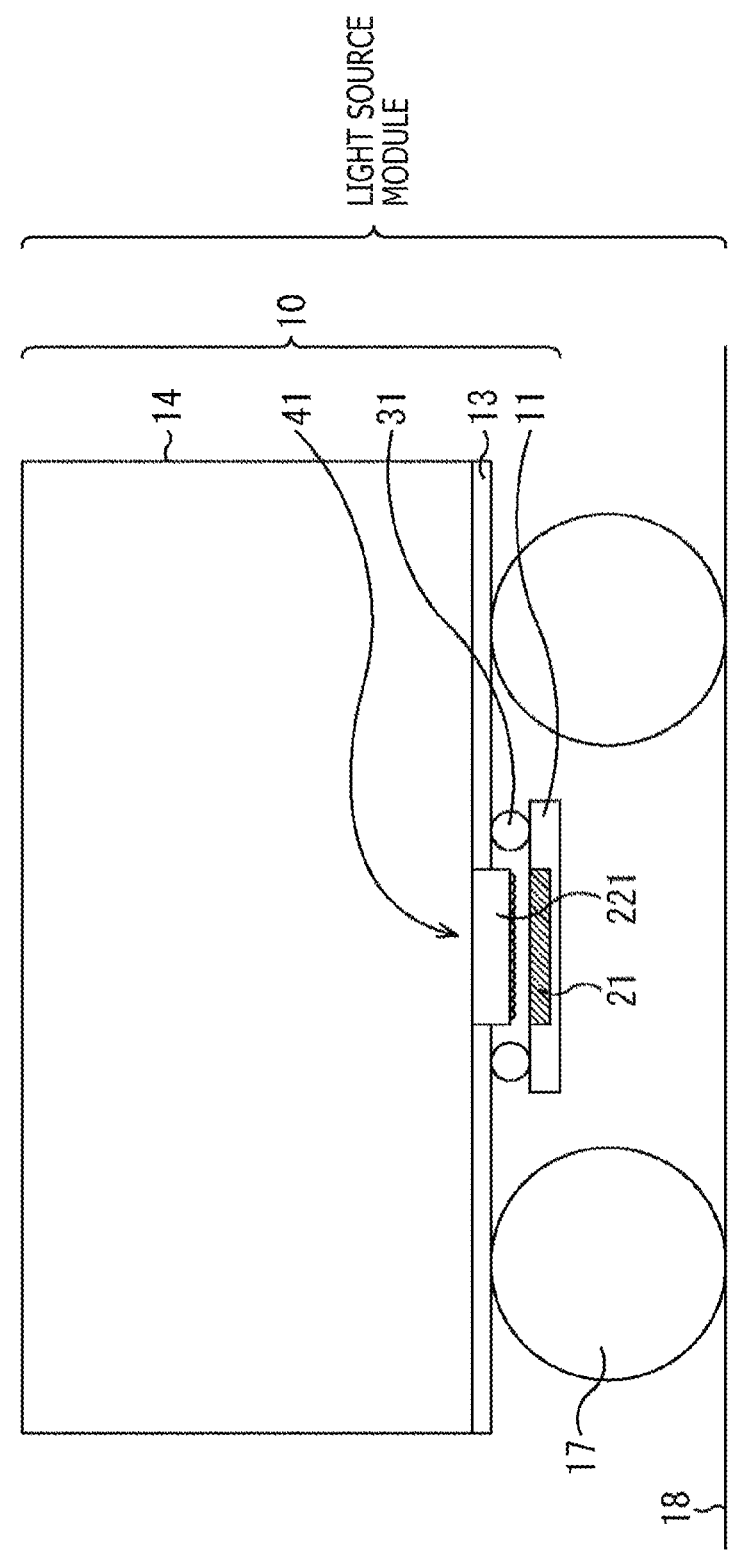
FIG. 7 is a cross-sectional view depicting a fifth configuration example of the light source chip 10.

FIG. 7 is a cross-sectional view depicting a fifth configuration example of the light source chip 10.

Note that portions in the figure that have counterparts in the cases of FIG. 1 and FIG. 2 are given identical reference characters, and explanations thereof are omitted as appropriate below.

In FIG. 7, the light source chip 10 includes the light-emitting board 11, the circuit board 13, the transmissive board 14 and a lens array 221.

Accordingly, the light source chip 10 in FIG. 7 is the same as in the cases of FIG. 1 and FIG. 2 in that the light source chip 10 has the light-emitting board 11, the circuit board 13, and the transmissive board 14. It should be noted that the light source chip 10 in FIG. 7 is different from the light source chip 10 in the cases of FIG. 1 and FIG. 2 in that the lens array 221 is provided additionally.

Similarly to the lens array 201 in FIG. 5, the lens array 221 is provided on the light-emitting-board-11 side of the transmissive board 14.

Similarly to the lens array 201, the lens array 221 includes microlenses similar to the lens 15 that are arranged similarly to the light-emitting points of the light-emitting board 11.

Similarly to the lens array 201, the lens array 221 is provided on the light-emitting board 11 such that the optical axes of the light-emitting points of the light-emitting board 11 and the optical axes of the microlenses corresponding to the light-emitting points are arranged approximately coaxially.

It should be noted that the lens array 221 is supported by being fit into the opening 41 of the circuit board 13 and adhered to the transmissive board 14. In addition, the lens array 221 is supported by the transmissive board 14 such that a space is formed between the lens array 221 and the light-emitting element 21 of the light-emitting board 11.

In this case, the stress of the lens array 221 can be prevented from being applied directly to the light-emitting element 21 of the light-emitting board 11.

For example, 10 to 50 µm can be adopted as the distance between the light-emitting element 21 of the light-emitting board 11 and the lenses of the lens array 221.

Note that the lens array 221 can be provided such that the microlenses provided on a flat plate are arranged on a side (the lower side in the figure) from which light from the light-emitting board 11 enters.

<Sixth Configuration Example of Light Source Chip>

Figure 8:
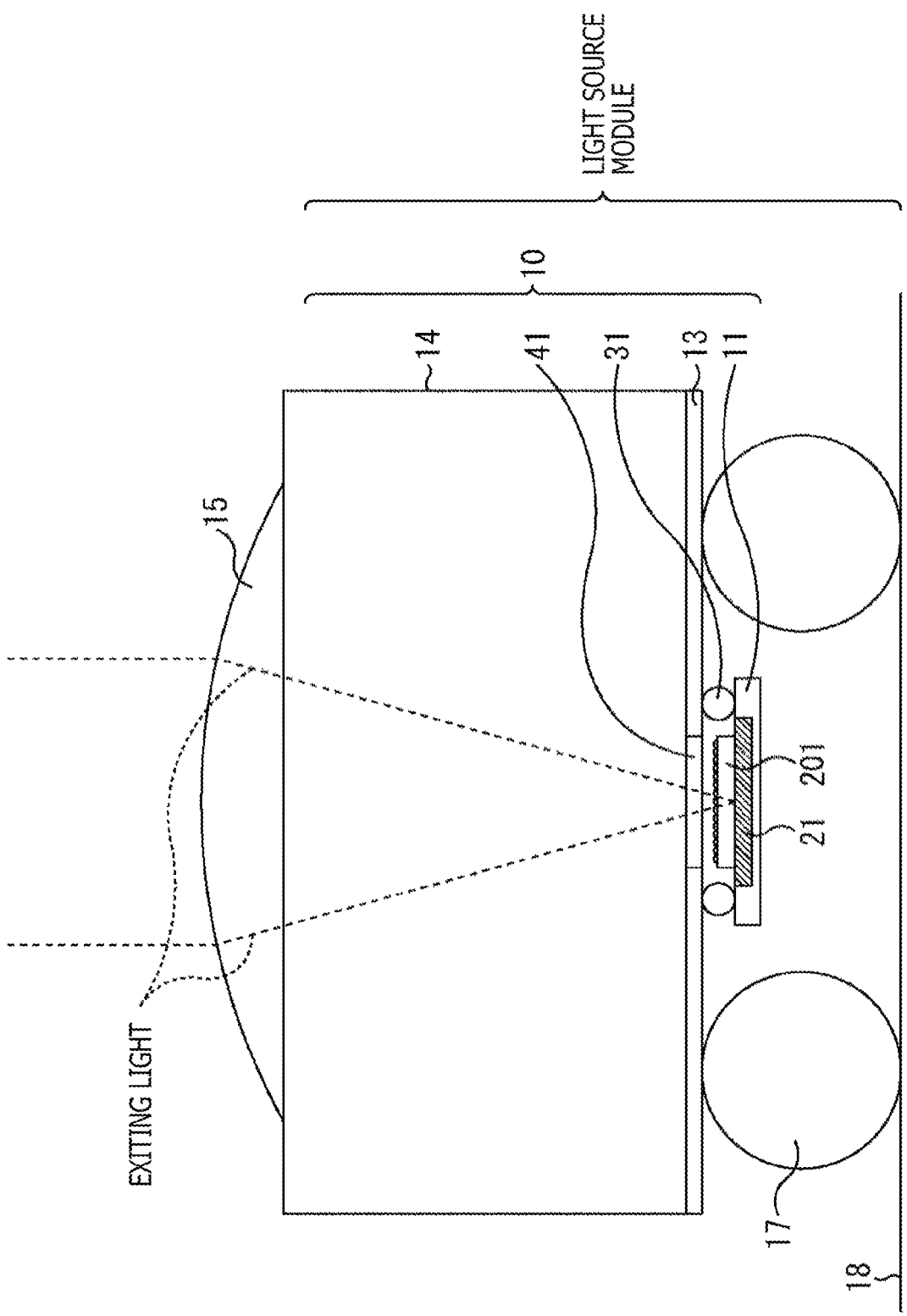
FIG. 8 is a cross-sectional view depicting a sixth configuration example of the light source chip 10.

FIG. 8 is a cross-sectional view depicting a sixth configuration example of the light source chip 10.

Note that portions in the figure that have counterparts in the cases of FIG. 1 and FIG. 2 are given identical reference characters, and explanations thereof are omitted as appropriate below.

In FIG. 8, the light source chip 10 includes the light-emitting board 11, the circuit board 13, the transmissive board 14, the lens 15, and the lens array 201.

Accordingly, the light source chip 10 in FIG. 8 is the same as in the cases of FIG. 1 and FIG. 2 in that the light source chip 10 has the light-emitting board 11, the circuit board 13, and the transmissive board 14. However, the light source chip 10 in FIG. 8 is different from the light source chip 10 in the cases of FIG. 1 and FIG. 2 in that the lens 15 and the lens array 201 are provided additionally.

The lens 15 and the lens array 201 are explained with reference to FIG. 4 and FIG. 5, respectively, and therefore explanations thereof are omitted.

Note that, in the sixth configuration example of the light source chip 10, the lens array 211 in FIG. 6 or the lens array 221 in FIG. 7 can be provided instead of the lens array 201.

<Method of Mounting Light Source Chip 10 on Flexible Board 18>

Figure 9:
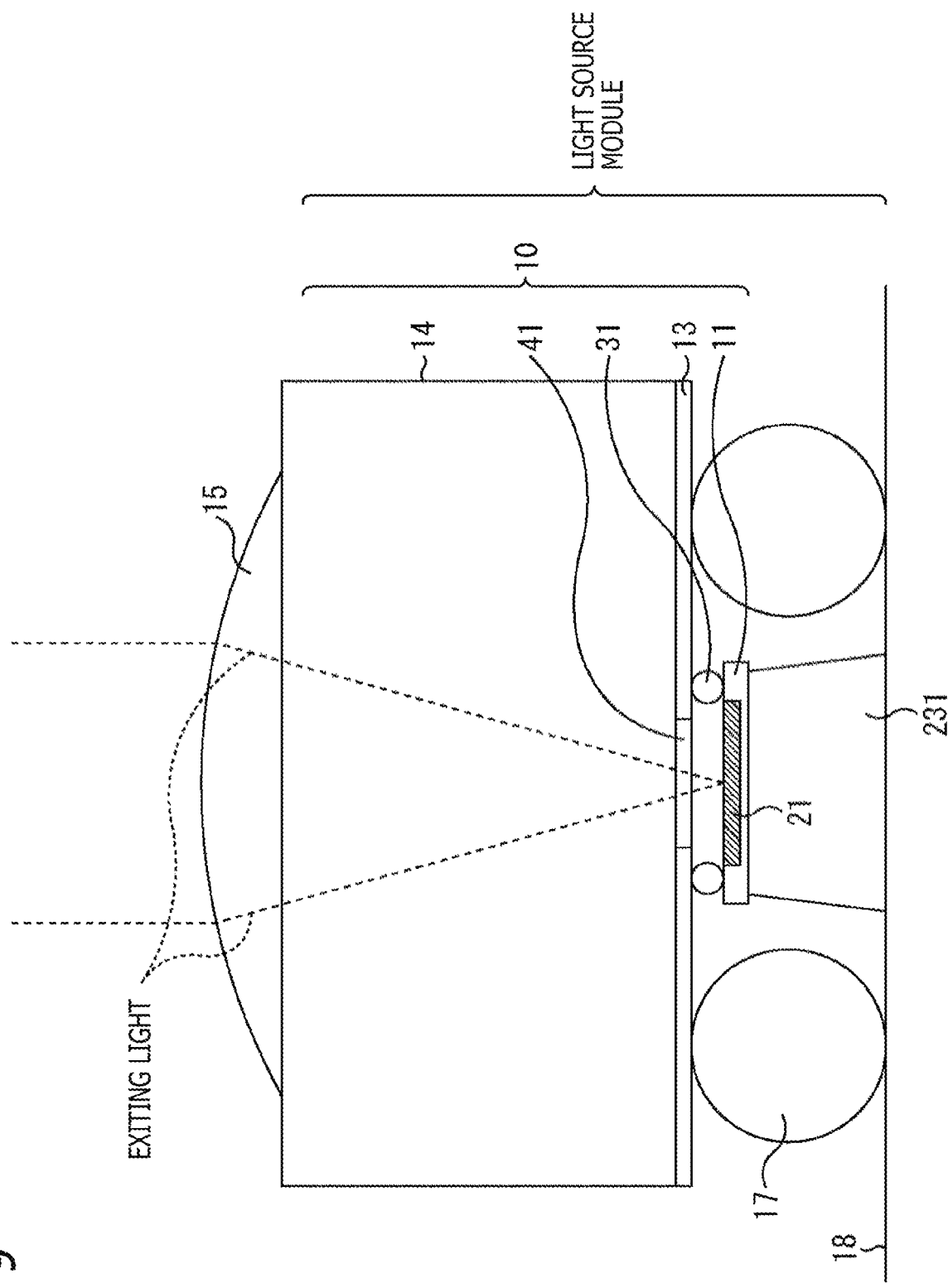
FIG. 9 is a cross-sectional view for explaining a first alternative method for mounting the light source chip 10 on a flexible board 18.

FIG. 9 is a cross-sectional view for explaining a first alternative method for mounting the light source chip 10 on the flexible board 18.

Other than the method of only electrically connecting the circuit board 13 and the flexible board 18 via the second bumps 17 such that the light-emitting board 11 is sandwiched therebetween as explained with reference to FIG. 1 and FIG. 2, alternative mounting methods can be adopted as the mounting method for the mounting of the light source chip 10 on the flexible board 18.

FIG. 9 is a cross-sectional view depicting the light source chip 10 mounted on the flexible board 18 by the first alternative mounting method.

Here, a surface emitting laser or the like can be used as the light-emitting element 21. The surface emitting laser or the like as the light-emitting element 21 has a low light emission duty (Duty) of 1% or lower, but can emit light with a high light intensity of approximately 15 W with 100 mesas (100 light-emitting points).

Because, if heat is confined in (the light-emitting board 11 having) the light-emitting element 21, heat resistance increases, and optical power lowers, it is desirable that the light source chip 10 has a high heat dissipation property.

By forming a heat dissipating body (heat dissipation pillar) 231 directly under the light-emitting board 11 and between the light-emitting board 11 and the flexible board 18, the heat dissipation property of the light source chip 10 can be enhanced. The heat dissipating body 231 can be formed by using, for example, solder or the like.

By being formed directly on copper wires of the flexible board 18, the heat dissipating body 231 can enhance heat dissipation effects.

For example, SAC solder which is similar to solder used for portions other than the heat dissipating body 231, such as the first bumps 31 and the second bumps 17 can be adopted as the solder as the heat dissipating body 231.

In addition, for example, Bi solder having a melting point lower than other solder used for portions other than the heat dissipating body 231, such as the first bumps 31 and the second bumps 17 can be adopted as the solder as the heat dissipating body 231.

In a case that solder having a melting point lower than other solder, such as the first bumps 31 or the second bumps 17, is adopted as the solder as the heat dissipating body 231, the solder as the heat dissipating body 231 is cured later than curing of the other solder at the time of reflowing when the light source chip 10 is mounted on the flexible board 18.

Accordingly, at the time of the reflowing, the heat dissipating body 231 can reduce the (uneven) stress applied to the backside of the light-emitting board 11. Here, the backside of the light-emitting board 11 or the like is a surface opposite to a front side which is located on a side where light exits from the light source chip 10.

Figure 10:
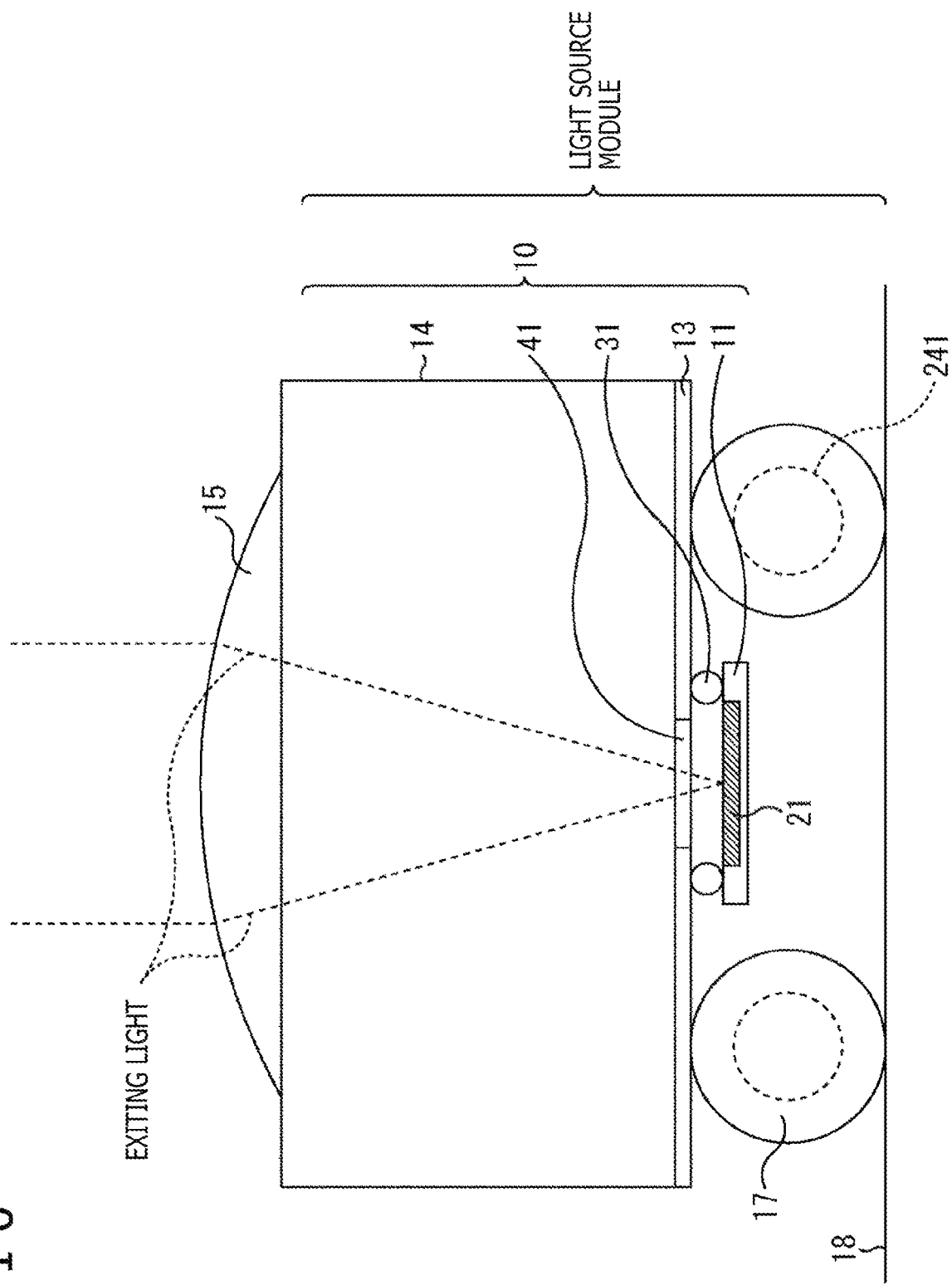
FIG. 10 is a cross-sectional view for explaining a second alternative method for mounting the light source chip 10 on the flexible board 18.

FIG. 10 is a cross-sectional view for explaining a second alternative method for mounting the light source chip 10 on the flexible board 18.

FIG. 10 is a cross-sectional view depicting the light source chip 10 mounted on the flexible board 18 by the second alternative mounting method.

In FIG. 10, for example, Cu core solder balls having therein core bodies (core members) 241 such as copper are adopted as the solder (balls) as the second bumps 17.

In a case that the second bumps 17 has therein the core bodies 241, the core bodies 241 can maintain a predetermined distance between the light source chip 10 and the flexible board 18 and reduce the likelihood of inclination of the light source chip 10 mounted on the flexible board 18.

Figure 11:
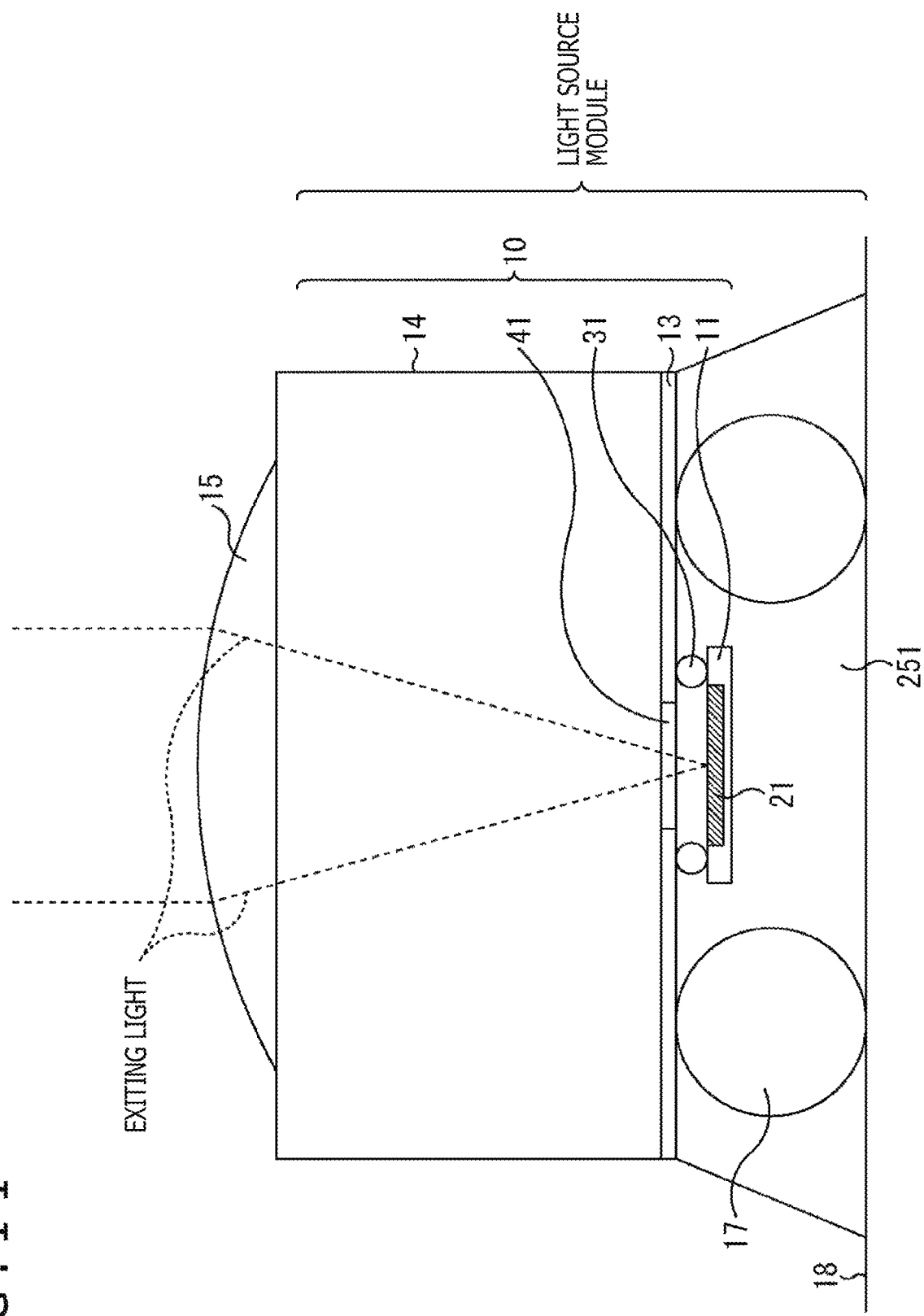
FIG. 11 is a cross-sectional view for explaining a third alternative method for mounting the light source chip 10 on the flexible board 18.

FIG. 11 is a cross-sectional view for explaining a third alternative method for mounting the light source chip 10 on the flexible board 18.

FIG. 11 is a cross-sectional view depicting the light source chip 10 mounted on the flexible board 18 by the third alternative mounting method.

Because the light-emitting board 11 is connected to the circuit board 13 by the first bumps 31 in the light source chip 10, the light-emitting board 11 seemingly stays floating in a space.

By sealing a gap between the circuit board 13 and the flexible board 18 by using an under-filler material 251 such as a sealing resin for heat dissipation in the light source chip 10 having the light-emitting board 11 in such a state, the light source chip 10 can be formed integrally with the flexible board 18. Thereby, the heat dissipation property of the structure of a light source module having the light source chip 10 mounted on the flexible board 18 can be enhanced.

Two or more mounting methods in the first to third alternative mounting methods can be combined with each other.

For example, by combining the first and third alternative mounting methods with each other, the heat dissipation property can be enhanced further.

<Configuration Examples of Light Source Module>

Figure 12:
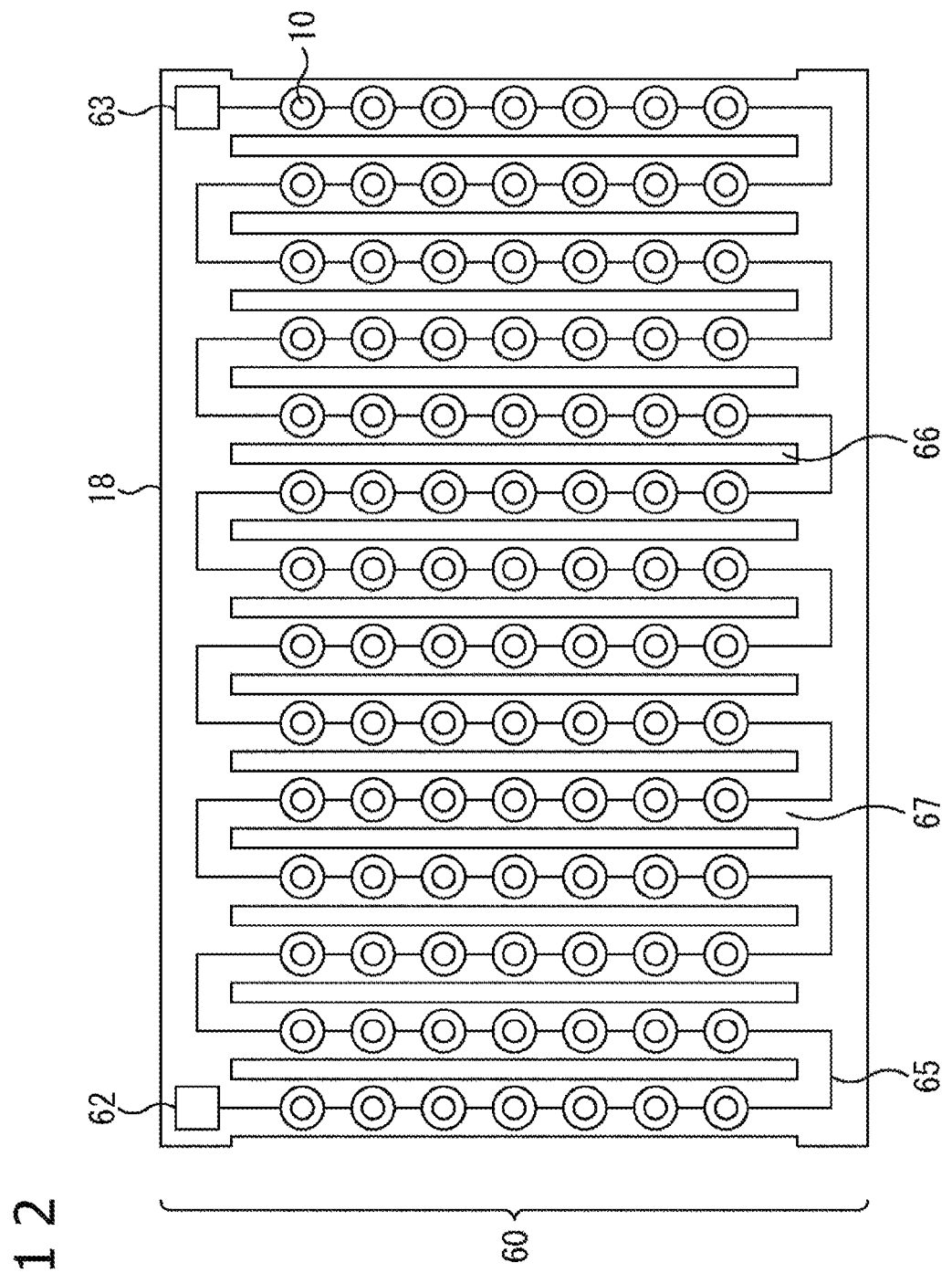
FIG. 12 is a plan view depicting a first configuration example of a light source module to which the light source chips 10 are applied.

FIG. 12 is a plan view depicting a first configuration example of a light source module to which the light source chips 10 are applied.

In FIG. 12, a light source module 60 has a plurality of the light source chips 10, the flexible board 18, a control element 62, and an interface element 63.

The plurality of light source chips 10 is configured similarly to the light source chip 10 in FIG. 1 and the like and are next to each other in series on the flexible board 18 with the control element 62 being connected at their starting point, and the interface element 63 being connected at their end point.

In FIG. 12, on an approximately rectangular flexible board, the flexible board 18 is formed in a ladder shape having slits 66 as breaks provided at predetermined intervals. That is, in FIG. 12, the slits 66 are provided to leave unoccupied the top and bottom ends of the flexible board 18 in the vertical direction in the figure, and this gives the flexible board 18 a horizontally-placed ladder shape.

One or more light source chips 10 are arranged in each thin approximately rectangular strip area 67 between adjacent slits 66 of the flexible board 18. The strip areas 67 are areas corresponding to rungs of the ladder.

In FIG. 12, the control element 62 and the interface element 63 are arranged at the upper left and upper right of the flexible board 18, respectively.

The plurality of light source chips 10, the control element 62, and the interface element 63 arranged on the flexible board 18 are connected with connection wires 65. As the connection wires 65, there are, for example, a clock pair differential wire, a data pair differential wire, other several types of control wire, or the like. Furthermore, as the connection wires 65, there are, for example, an electric power supply line of a 3.3-V power supply and a GND line as connection wires of a power supply system.

Figure 13:
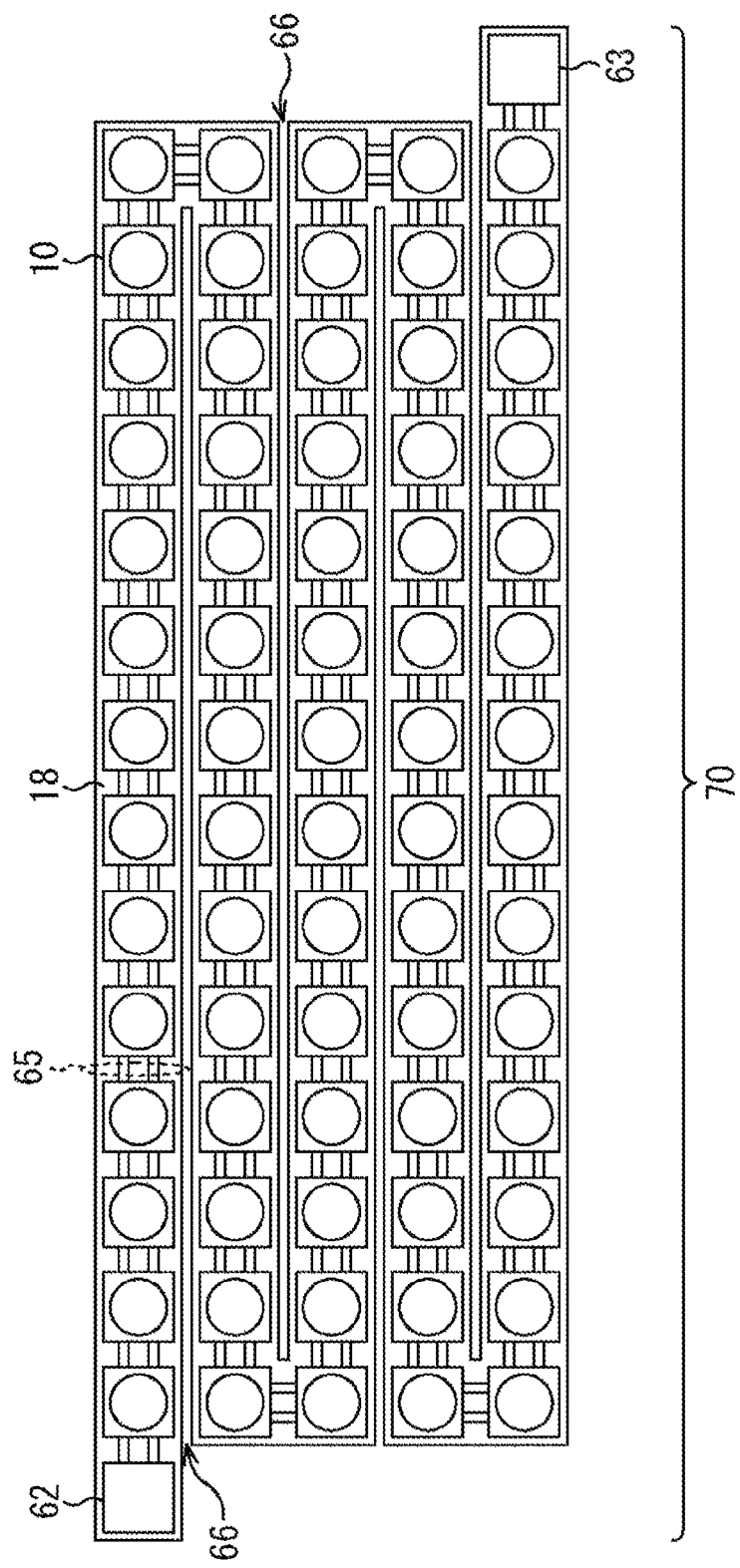
FIG. 13 is a plan view depicting a second configuration example of a light source module to which the light source chips 10 are applied.

FIG. 13 is a plan view depicting a second configuration example of a light source module to which the light source chips 10 are applied.

Note that portions in the figure that have counterparts in FIG. 12 are given identical reference characters, and explanations thereof are omitted as appropriate below.

In FIG. 13, a light source module 70 has a plurality of the light source chips 10, the flexible board 18, the control element 62, and the interface element 63.

The plurality of light source chips 10 is configured similarly to the light source chip 10 in FIG. 1 and the like and are next to each other in series on the flexible board 18 with the control element 62 being connected at their starting point, and the interface element 63 being connected at their end point.

In FIG. 13, on an approximately rectangular flexible board, the flexible board 18 is formed in a zigzag shape having the slits 66 as breaks provided at predetermined intervals. That is, in FIG. 13, the slits 66 are provided to leave unoccupied the left end and right end of the flexible board 18 alternately in the horizontal direction in the figure, and this gives the flexible board 18 a zigzag shape.

The plurality of light source chips 10, the control element 62 and the interface element 63 are arranged on the zigzag-shaped flexible board 18 as mentioned above.

That is, the control element 62 and the interface element 63 are arranged at the upper left and lower right of the flexible board 18, respectively. Then, the plurality of light source chips 10 is arranged along the zigzag-shaped flexible board 18 between the control element 62 and the interface element 63 such that the control element 62 and the interface element 63 are linked like one-stroke writing.

Figure 14:
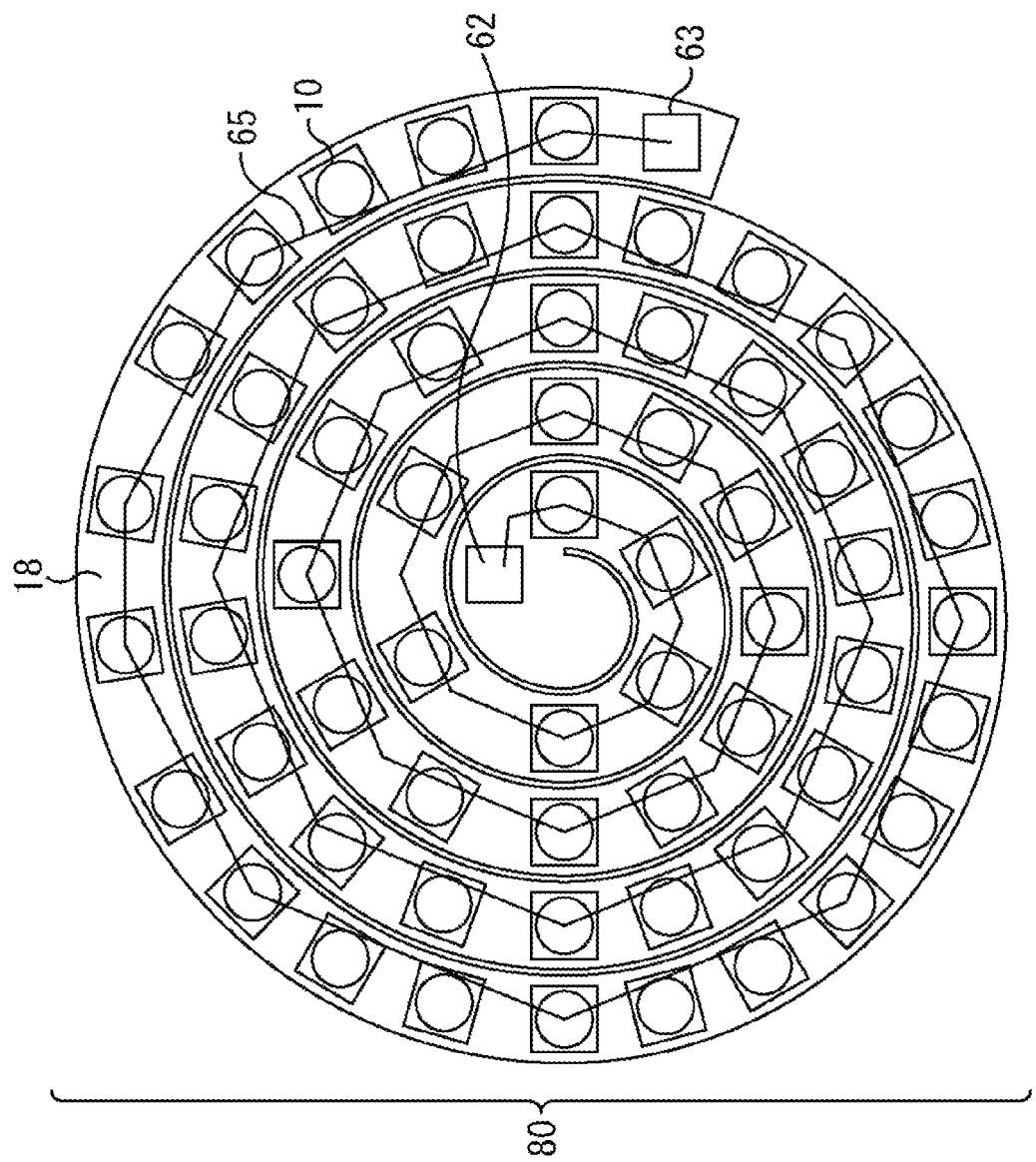
FIG. 14 is a plan view depicting a third configuration example of a light source module to which the light source chips 10 are applied.

FIG. 14 is a plan view depicting a third configuration example of a light source module to which the light source chips 10 are applied.

Note that portions in the figure that have counterparts in FIG. 12 are given identical reference characters, and explanations thereof are omitted as appropriate below.

In FIG. 14, a light source module 80 has a plurality of the light source chips 10, the flexible board 18, the control element 62, and the interface element 63.

The plurality of light source chips 10 is configured similarly to the light source chip 10 in FIG. 1 and the like and are next to each other in series on the flexible board 18 with the control element 62 being connected at their starting point, and the interface element 63 being connected at their end point.

In FIG. 14, the flexible board 18 is formed in a swirl shape, and the plurality of light source chips 10, the control element 62, and the interface element 63 are arranged on such a swirl-shaped flexible board 18.

That is, the control element 62 and the interface element 63 are arranged at the inner end point and outer end point of the swirl-shaped flexible board 18, respectively. Then, the plurality of light source chips 10 is arranged along the swirl-shaped flexible board 18 between the control element 62 and the interface element 63 such that the control element 62 and the interface element 63 are linked like one-stroke writing.

The ladder-shaped, zigzag-shaped, or swirl-shaped flexible board 18 as mentioned above can be easily caused to conform to curved surfaces and various other shapes. Accordingly, the light source chips 10 arranged on the flexible board 18 can be arranged to conform to various shapes of base members which serve as the bases of light source modules.

Here, in a case that a plurality of the light source chips 10 is connected in series, the flexible board 18 may have a thin straight linear shape (a strip shape which is vertically long). However, in terms of cost reduction of the flexible board 18 to be included in a light source module, it is desirable to take out as many flexible boards 18 to serve as product boards as possible from a rectangular mother board. In view of this, preferred shapes of the flexible board 18 to be included in a light source module include a ladder shape, a zigzag shape, a swirl shape, and the like as mentioned above. It should be noted that the shape of the flexible board 18 is not limited to these shapes, but may be shapes such as other linear shapes or radial shapes.

Note that, in terms of power supply, the swirl-shaped flexible board 18, which is a very long strip with a small width, can create a concern over voltage reduction (voltage drop) or the like on a power supply layer. That is, whereas a sufficient voltage can be applied to both end sections of the swirl-shaped flexible board 18, a middle section (a portion far from the end points of the swirl) is naturally distant from a power supply section, and therefore voltage reduction due to the board wire resistance becomes a problem in some cases. On the other hand, the ladder-shaped flexible board 18 can supply power to the light source chips 10 arranged in the strip areas 67 from end sections of the strip areas 67 in the longitudinal direction. Accordingly, the ladder-shaped flexible board 18 can mitigate the problem of voltage reduction that can occur in the swirl-shaped flexible board 18. The zigzag-shaped flexible board 18 can also mitigate the problem of the voltage reduction similarly.

Figure 15:
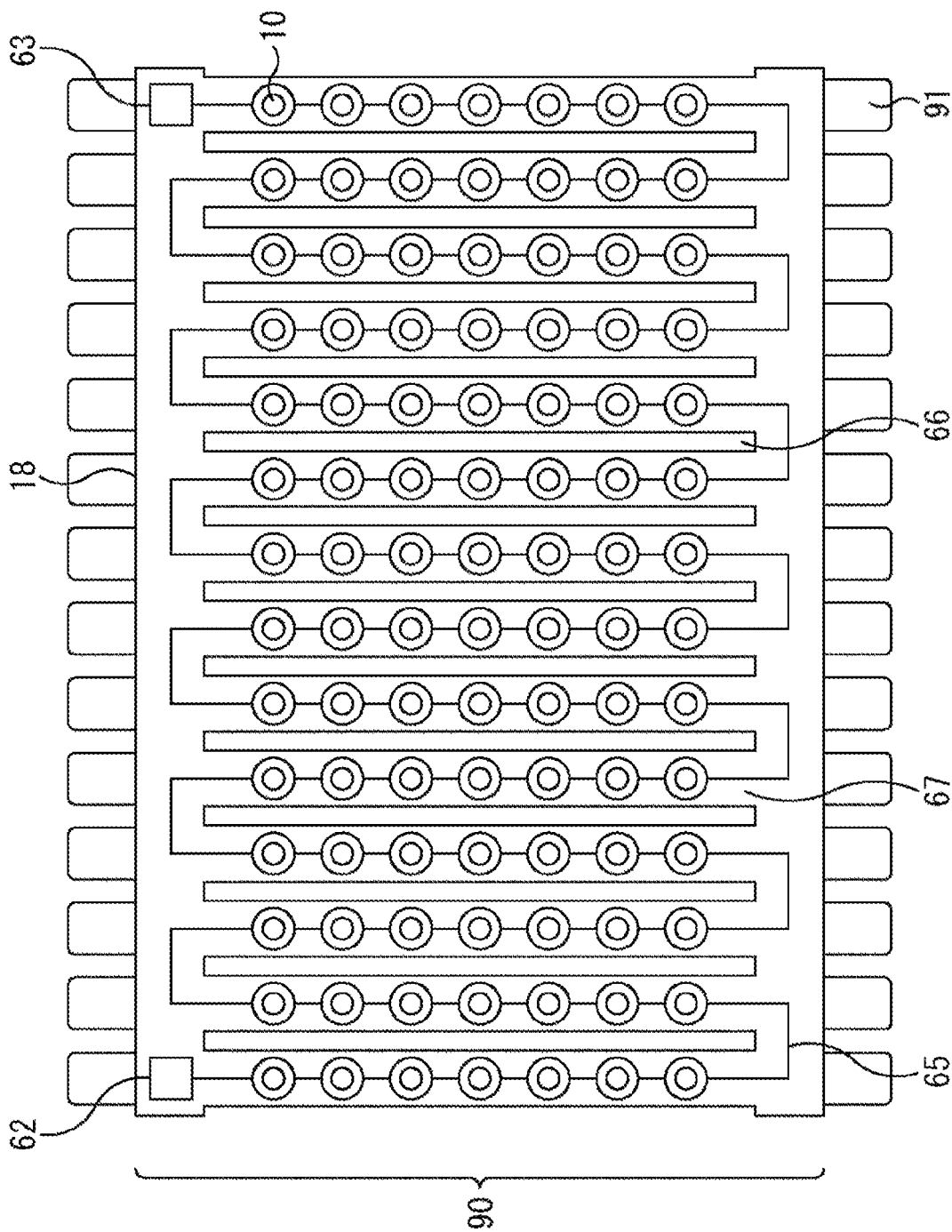
FIG. 15 is a plan view depicting a fourth configuration example of a light source module to which the light source chips 10 are applied.

FIG. 15 is a plan view depicting a fourth configuration example of a light source module to which the light source chips 10 are applied.

Note that portions in the figure that have counterparts in FIG. 12 are given identical reference characters, and explanations thereof are omitted as appropriate below.

In FIG. 15, similarly to the light source module 60 in FIG. 12, a light source module 90 includes a plurality of the light source chips 10, the control element 62 and the interface element 63 that are arranged on the ladder-shaped flexible board 18.

Further, the light source module 90 is provided with reinforcing materials 91 that support the flexible board 18.

In FIG. 15, the reinforcing materials 91 are flat-plate members with a (widthwise) width which is approximately the same with the thickness of the strip areas 67 and a thickness of approximately 0.5 mm, and are adhered to the backsides of the strip areas 67 (surfaces opposite to surfaces on which the light source chips 10 are arranged).

The reinforcing materials 91 can include, for example, a metal such as stainless, aluminum, or copper.

In a case that the reinforcing materials 91 include aluminum or copper, the heat dissipation property can be enhanced. It is preferred to use an adhesive having a high heat dissipation property as an adhesive used for adhering the reinforcing materials 91 to (the strip areas 67 of) the flexible board 18.

The flexible board 18 having the reinforcing materials 91 adhered thereon as mentioned above deforms along with the reinforcing materials 91 and thus maintains the shape after the deformation.

Accordingly, the flexible board 18 can be deformed into a desired shape, and the arrangement of the light source chips 10 conforming to the desired shape can be realized, without damaging the light source chips 10 arranged on the flexible board 18.

For example, by deforming, in advance, the flexible board 18 having the reinforcing materials 91 adhered thereon into a desired shape by using a jig or the like, and adhering and fixing, by using an adhesive or the like, the flexible board 18 after the deformation onto a base member including a metal such as aluminum or aluminum nitride, the light source chips 10 can be arranged to conform to a surface of the base member.

Figure 16:
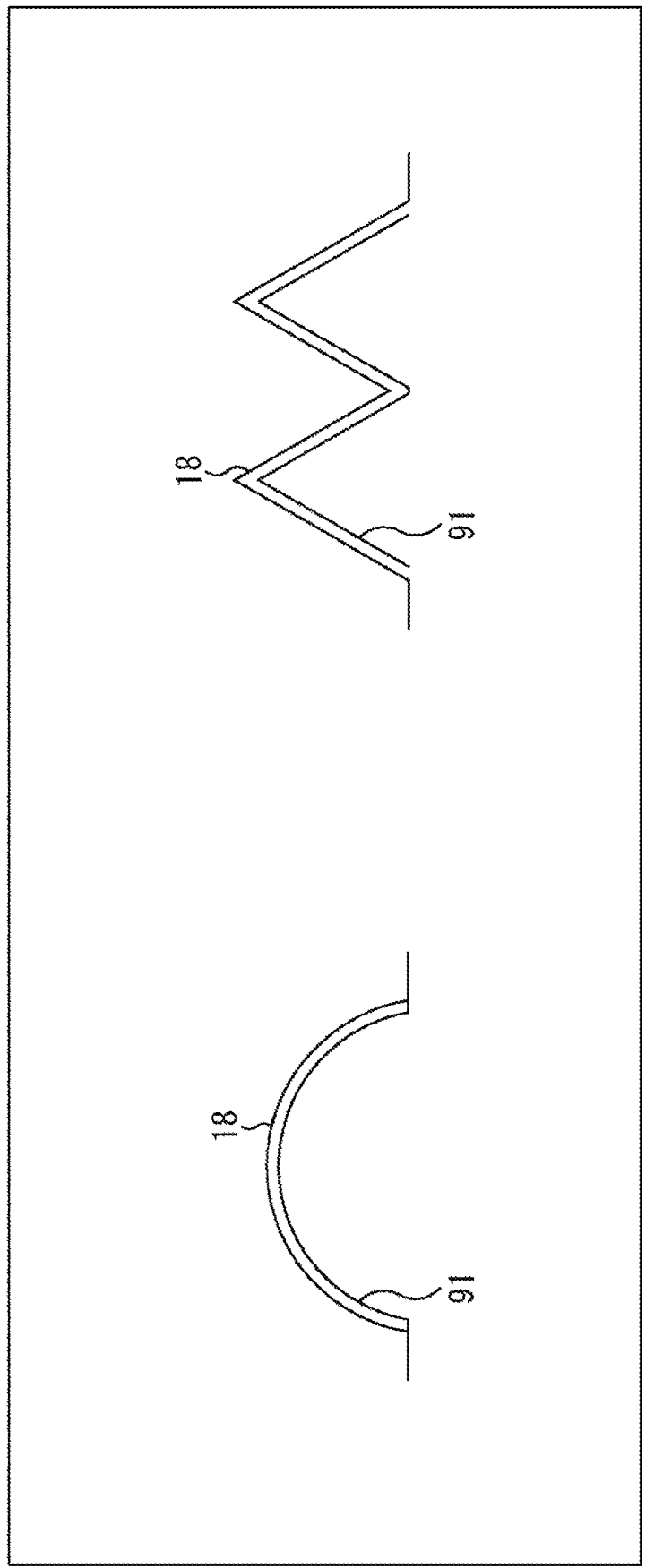
FIG. 16 is a cross-sectional view depicting examples of deformation of the flexible board 18 having a reinforcing material 91 adhered thereon.

FIG. 16 is a cross-sectional view depicting examples of deformation of the flexible board 18 having a reinforcing material 91 adhered thereon.

By pressing the flexible board 18 having the reinforcing material 91 adhered thereon against, for example, a base member having a hemispherical surface or a base member having a surface with a triangular recessed and protruding shape, the flexible board 18 can be easily deformed into the shape of the surface of the base member. That is, the flexible board 18 can be easily deformed into, for example, the hemispherical (curved) shape, the triangular recessed and protruding shape, another complicated three-dimensional shape, or the like.

Note that, other than being provided on the ladder-shaped flexible board 18, the reinforcing materials 91 can be provided on the zigzag-shaped flexible board 18, the swirl-shaped flexible board 18, and the like.

<Configuration Examples of Distance Measurement Module>

Figure 17:
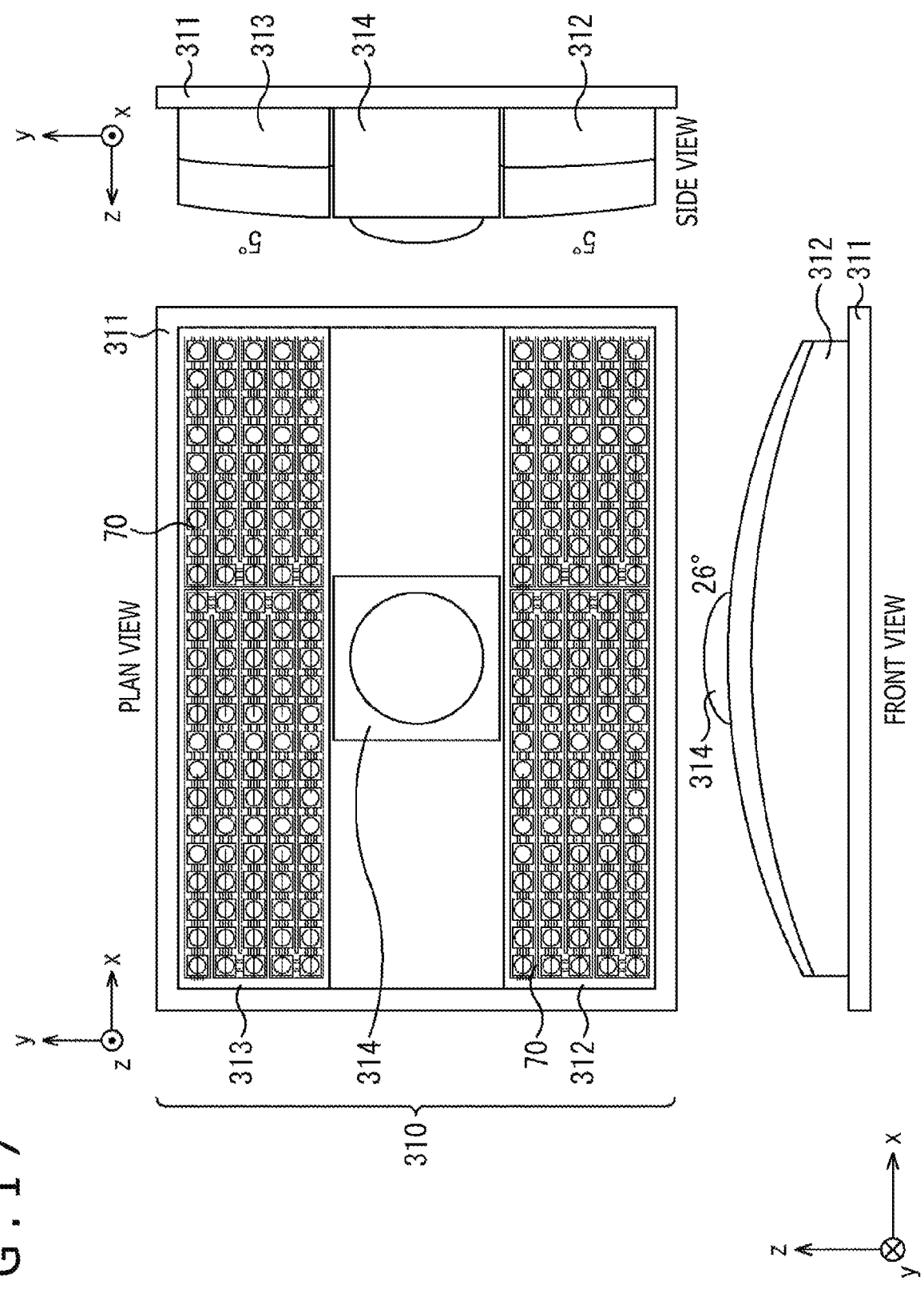
FIG. 17 is a figure depicting a first configuration example of a distance measurement module to which the light source chips 10 are applied.

FIG. 17 is a figure depicting a first configuration example of a distance measurement module to which the light source chips 10 are applied.

In FIG. 17, a distance measurement module 310 includes the light source module 70, a substrate 311, base members 312 and 313, and a light-receiving section 314.

The substrate 311 includes a flat-plate board. In the front view, the base members 312 and 313 are arranged on the nearer side and farther side of the substrate 311, respectively, and the light-receiving section 314 is arranged between the base members 312 and 313.

The base member 312 includes a material having a high heat dissipation property, for example, a metal such as aluminum or ceramics such as aluminum nitride. The base member 312 is configured in a rectangular parallelepiped shape which is horizontally long when seen in the front view. The top surface of the base member 312 is curved in the x-y direction, and has a curved surface.

Then, the light source module 70 (FIG. 13) is attached to the top surface of the base member 312 by adhesion or the like. By providing the reinforcing materials 91 to the light source module 70, and pressing and deforming, along with the reinforcing materials 91, the flexible board 18 against the top surface of the base member 312 in advance, (the flexible board 18 of) the light source module 70 can be easily adhered to conform to the curved surface of the top surface of the base member 312.

The curved surface of the top surface of the base member 312 is curved such that perpendicular lines perpendicular to the curved surface spread within the range of 26 degrees in the front view and spread within the range of 5 degrees in the side view. Accordingly, light exits from the light source module 70 attached to such a curved surface such that the light spreads radially.

The base member 313 is configured such that the base member 313 becomes axially symmetrical to the base member 312 in a state that both are arranged on the substrate 311.

As mentioned above, the base members 312 and 313 and the light-receiving section 314 are arranged on the substrate 311, and the light source module 70 is attached to the base members 312 and 313. Accordingly, the light source chips 10 of the light source module 70 and the light-receiving section 314 can be said to be arranged on the substrate 311 as one board.

As mentioned above, the light-receiving section 314 is arranged between the base members 312 and 313. Accordingly, the light source chips 10 of the light source module 70 adhered to the base members 312 and 313 are arranged around the light-receiving section 314.

The light-receiving section 314 has, for example, a light-receiving element (not depicted) such as an SPAD that receives light, and receives reflection light which is light having exited from the light source chips 10, and returning after being reflected off of a distance measurement target object. Then, the light-receiving section 314 (or a circuit which is not depicted) calculates the distance to the target object on the basis of the length of time that elapses from the time at which the light has been caused to exit from the light source chips 10 until the time at which the reflection light of the light is received.

Figure 18:
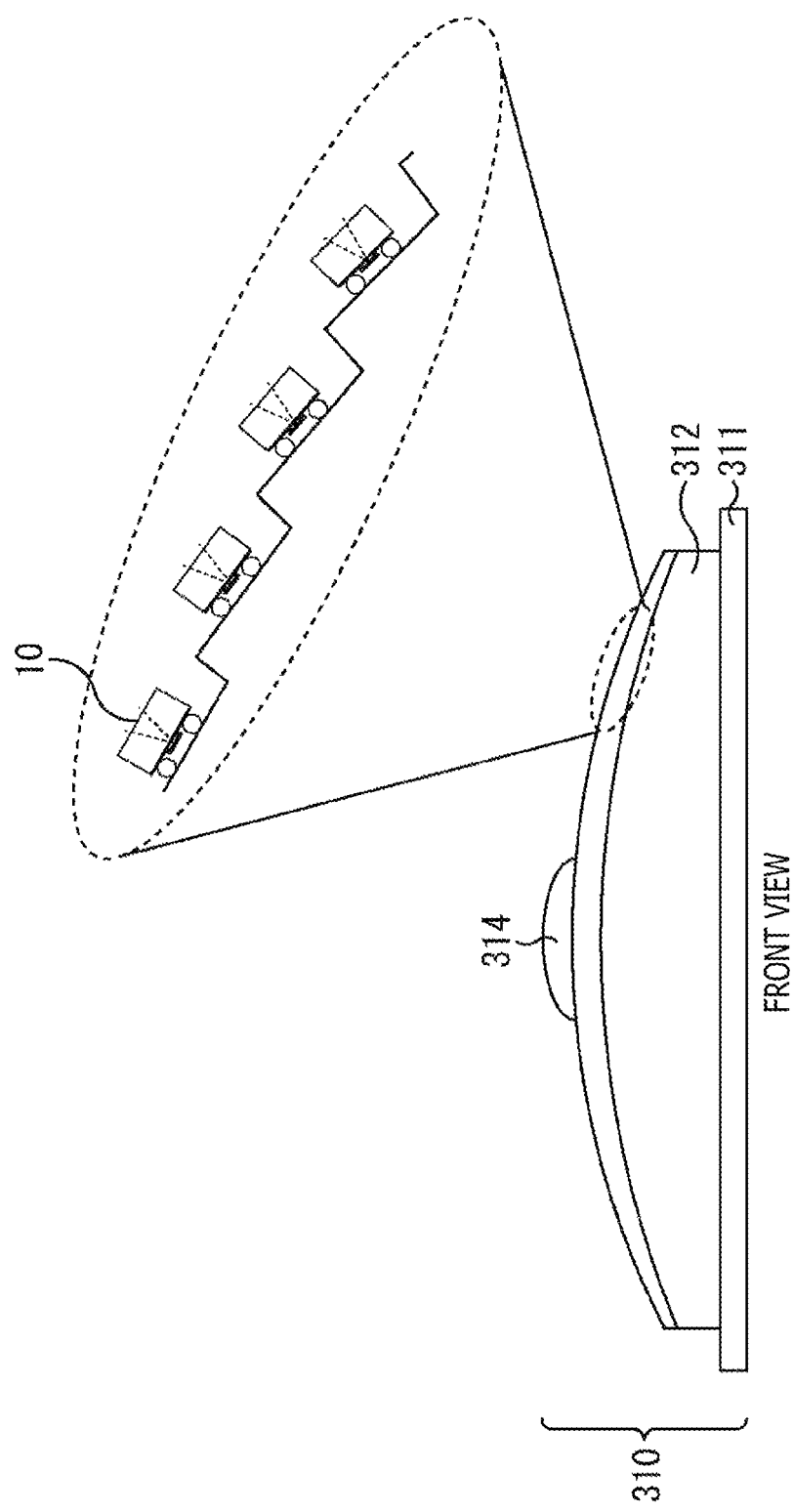
FIG. 18 is a front view for explaining a configuration example of a base member 312.

FIG. 18 is a front view for explaining a configuration example of the base member 312.

Note that the base member 313 is configured similarly to the base member 312.

The top surface of the base member 312 is a curved surface as explained with reference to FIG. 17. Other than being formed as a smooth curved surface, the curved surface of the top surface of the base member 312 can be configured as a curved surface having steps formed thereon as depicted in FIG. 18, and (the flexible board 18 of) the light source module 70 can be attached onto such a curved surface having the steps formed thereon.

In a case that the curved surface of the top surface of the base member 312 is configured such that perpendicular lines spread within a predetermined angular range as explained with reference to FIG. 17, the height of the base member 312 can be lowered more by adopting, as the curved surface, a curved surface having steps formed thereon than a smooth curved surface. Accordingly, it is possible to attempt to achieve size reduction of the distance measurement module 310.

Figure 19:
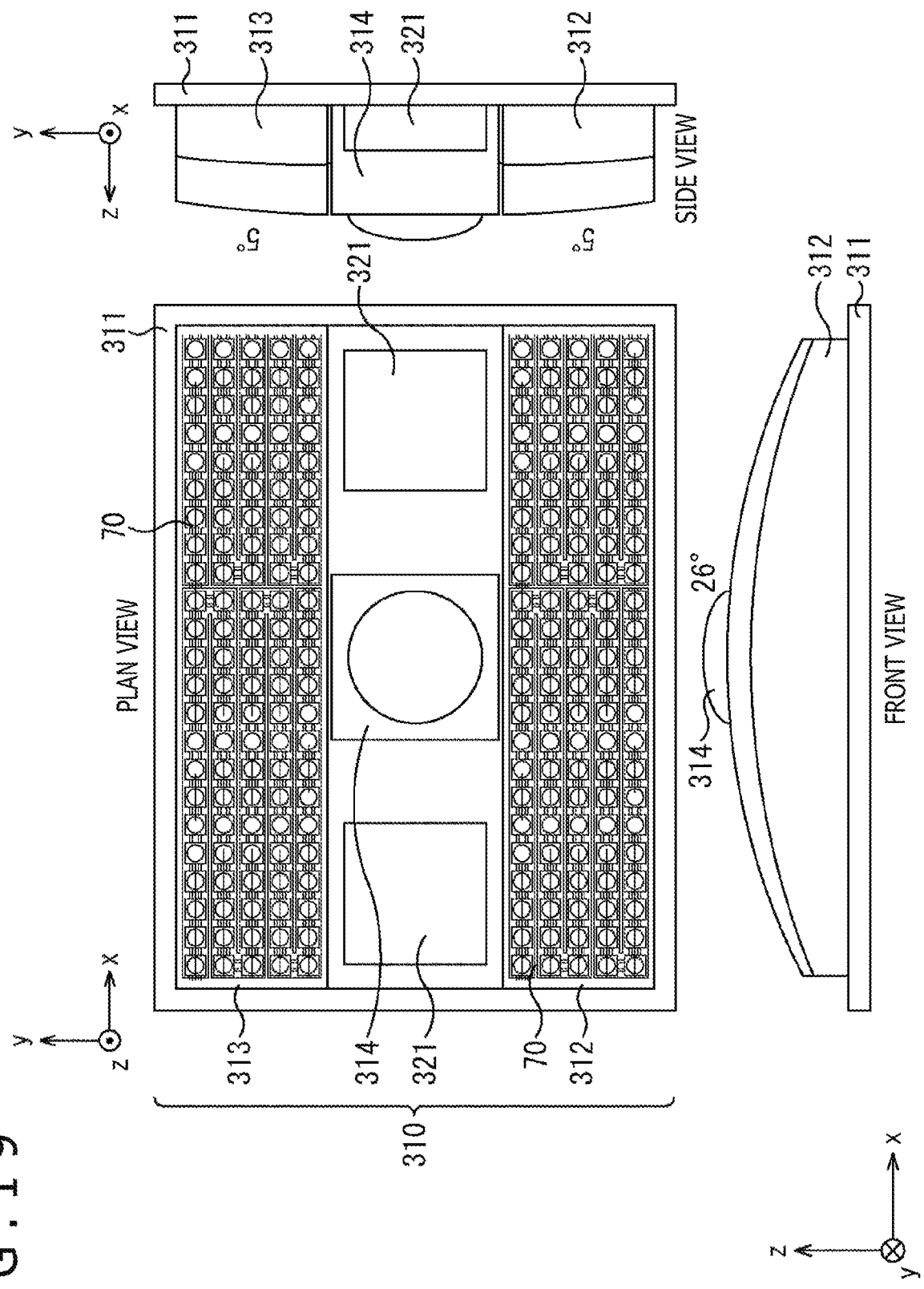
FIG. 19 is a figure depicting a second configuration example of the distance measurement module to which the light source chips 10 are applied.

FIG. 19 is a figure depicting a second configuration example of the distance measurement module to which the light source chips 10 are applied.

Note that portions in the figure that have counterparts in the case of FIG. 17 are given identical reference characters, and explanations thereof are omitted as appropriate below.

In FIG. 19, the distance measurement module 310 includes the light source module 70, the substrate 311, the base members 312 and 313, the light-receiving section 314, and fans 321.

Accordingly, the distance measurement module 310 in FIG. 18 is the same as in the case of FIG. 17 in that the distance measurement module 310 has the light source module 70, the substrate 311, the base members 312 and 313, and the light-receiving section 314. It should be noted that the distance measurement module 310 in FIG. 18 is different from the distance measurement module 310 in the case of FIG. 17 in that the fans 321 are provided additionally.

The fans 321 are an example of a cooling mechanism that cools the base members 312 and 313, and one fan 321 is provided to each of the left and right of the light-receiving section 314 in the plan view in FIG. 19.

Note that, other than the fans 321, heat sinks can be adopted as the cooling mechanism that cools the base members 312 and 313. In addition, for example, the base members 312 and 313 can be shaped in grids, and the grid-like base members 312 and 313 can be adopted as the cooling mechanism. Furthermore, a plurality of the cooling mechanisms mentioned above can be adopted.

Figure 20:
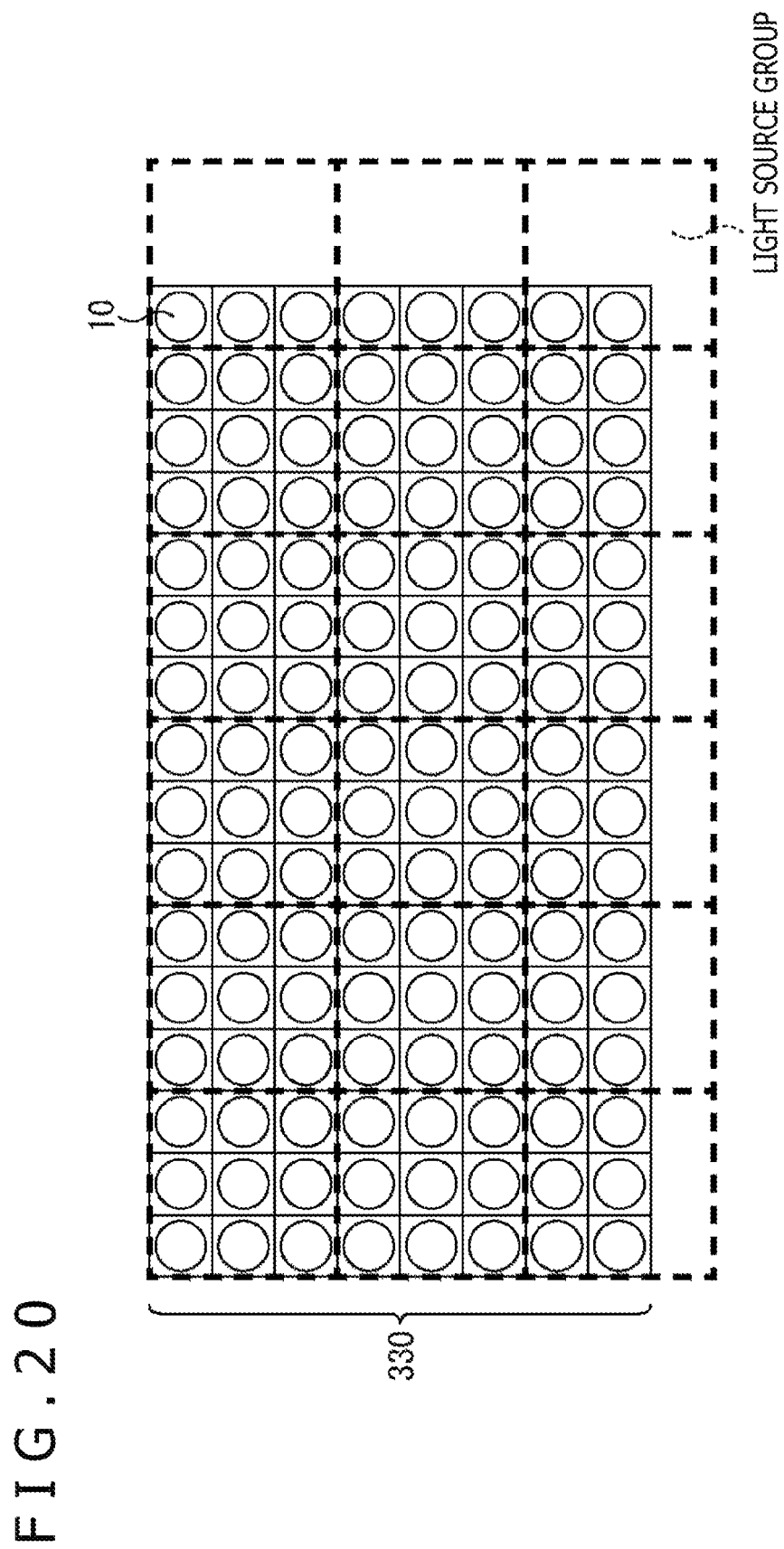
FIG. 20 is a figure for explaining control of a light source module 330 including a plurality of the light source chips 10 arranged therein.

FIG. 20 is a figure for explaining control of a light source module 330 including a plurality of the light source chips 10 arranged therein.

For example, in the light source module 330 including the plurality of light source chips 10 arranged therein like the light source modules 60, 70, 80 and 90 and the like, for example, the light source chips 10 can be grouped into groups each with a size of 3×3 light source chips 10 in the widthwise direction and depthwise direction, and thus can be grouped into light source groups each including 3×3 light source chips 10 or fewer. Then, light emission limit control of limiting light emission of the light source chips 10 can be performed such that, for example, only one light source chip 10 in each light source group is caused to emit light simultaneously. In the light emission limit control, the one light source chip 10 to be caused to emit light in each light source group can be selected sequentially or randomly.

By performing the light emission limit control, in the light source module 330, for example, light source chips 10 that are spaced two light source chips 10 apart in the widthwise direction and the depthwise direction are caused to emit light simultaneously.

According to the light emission limit control as mentioned above, in the light source module 330, simultaneous emission of light source chips 10 that are adjacent (in the widthwise direction, the depthwise direction, and the diagonal directions) is limited, and thus it is possible to comply with laser safety standards.

Figure 21:
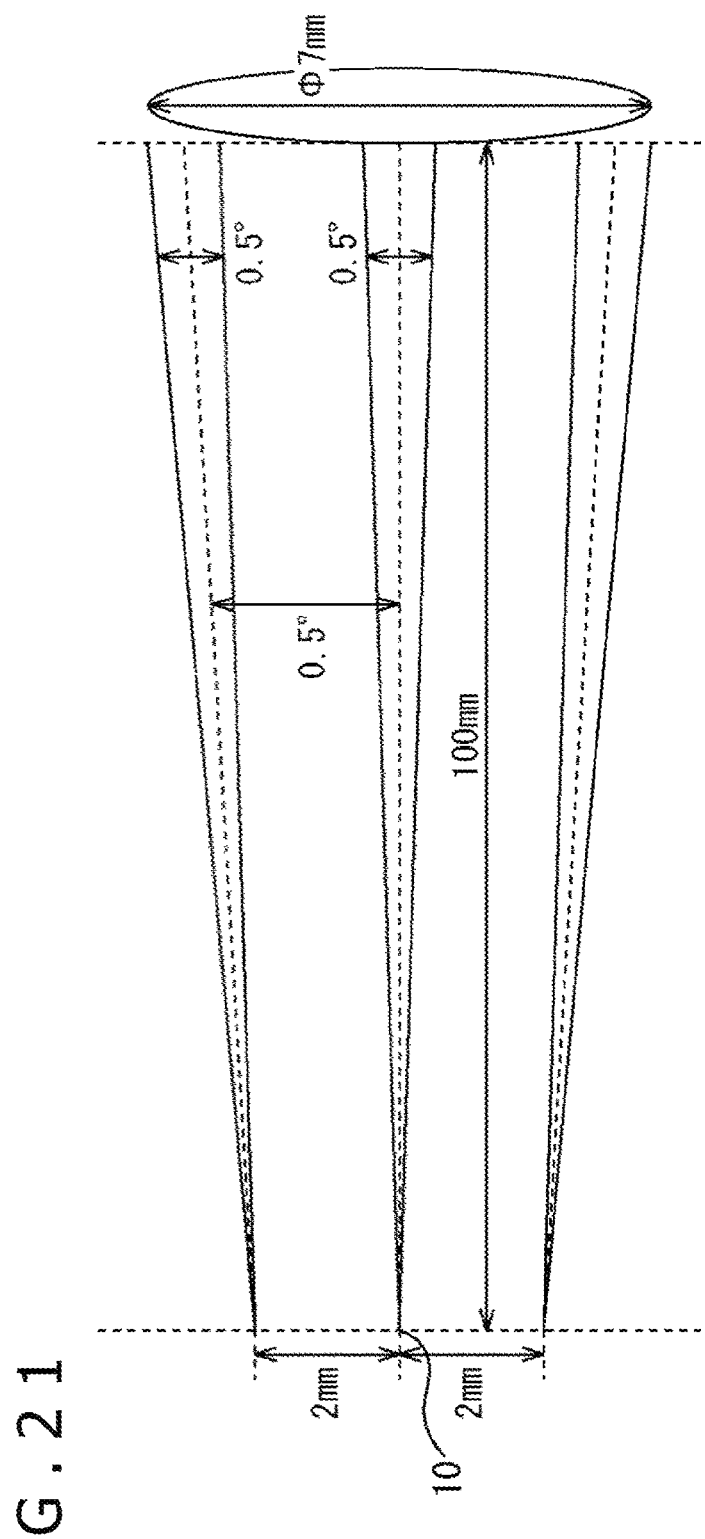
FIG. 21 is a figure for explaining laser safety standards.

FIG. 21 is a figure for explaining laser safety standards.

In a case that, in the light source module 330 having the plurality of light source chips 10 arranged therein, the light source chips 10 cause light (beams) corresponding to Class 1M of the laser safety standards to exit therefrom (emit the light), simultaneous emission of light from all of the light source chips 10 arranged in the light source module 330 can cause non-conformance to the laser safety standards.

For example, the laser safety standards stipulate that, in a case that light (beams) with a wavelength of 905 nm is used as exiting light (emitted light), the pulse interval should be equal to or longer than 5e-6, and AEL should be equal to or lower than 1.98e-7J (measurement area: area of φ 7 mm at a distance of 100 mm).

It is supposed here that the plurality of light source chips 10 is arranged in the light source module 330 at a pitch of 2 mm in the widthwise direction and the depthwise direction and at an inclination angle of 0.5 degrees and light exits therefrom at a beam divergence angle of 0.5 degrees.

In this case, if adjacent light source chips 10 in the light source module 330 emit light simultaneously, the area of φ 7 mm at a distance of 100 mm defined by the laser safety standards is irradiated with light having exited from a plurality of the light source chips 10. As a result, the light intensity in the area does not conform to the laser safety standards.

In view of this, by performing the light emission limit control in the light source module 330 to limit the number of light source chips to emit light simultaneously to one per light source group, it is possible to comply with the laser safety standards.

Furthermore, the light intensity of light that exits from each light source chip 10 in the light source module 330 can be set to the highest value that complies with the laser safety standards.

<Alternative Configuration Examples of Light Source Modules>

Figure 22:
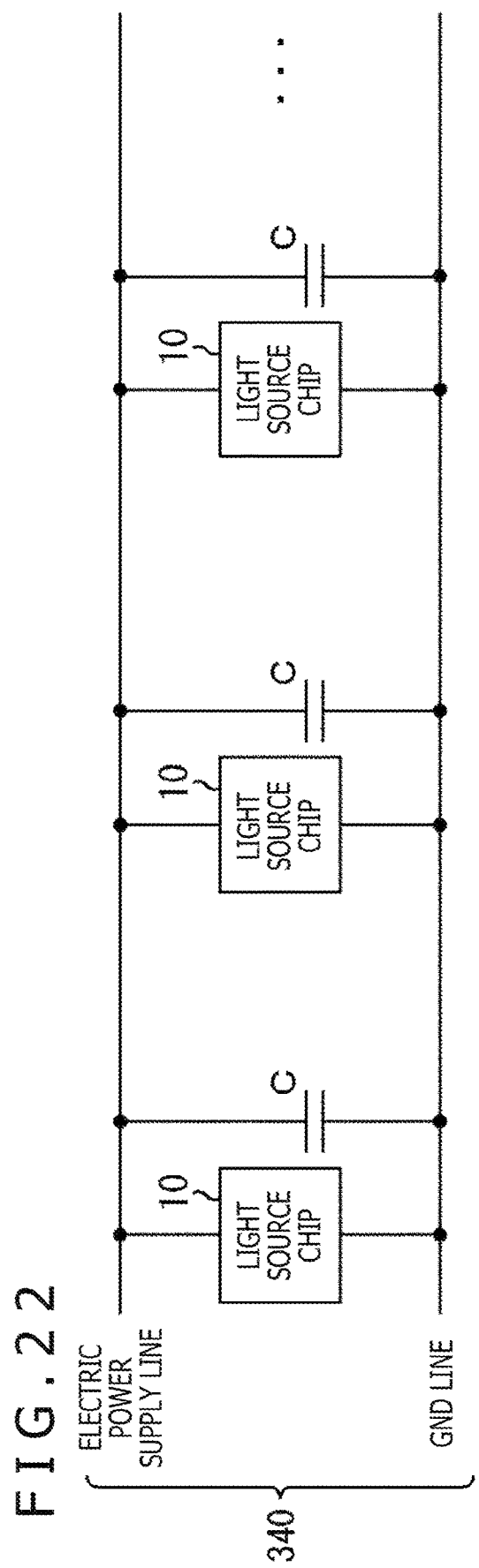
FIG. 22 is a block diagram depicting a fifth configuration example of a light source module to which the light source chips 10 are applied.

FIG. 22 is a block diagram depicting a fifth configuration example of a light source module to which the light source chips 10 are applied.

In FIG. 22, a light source module 340 includes a plurality of the light source chips 10 arranged therein. Furthermore, in the light source module 340, each of the light source chips 10 is provided with, for example, a 10- to 100-uF capacitor C which is located near the light source chip 10 and connects an electric power supply line and a GND line.

For example, in a case that the light intensity of light to exit from each light source chip 10 is set to the highest value that complies with the laser safety standards on the premise that the light emission limit control is performed in the light source module 340 as explained with reference to FIG. 21, each light source chip 10 emits light at light intensity (corresponding to electric power) which is as high as 15 W at a pulse width of 5 ns, for example.

In this case, it becomes difficult in some cases for all of the light source chips 10 of the light source module 340 to obtain sufficient electric power from the electric power supply line and the GND line.

For example, in a case that the light source module 340 is the light source module 60 in FIG. 12 having the ladder-shaped flexible board 18, and electric power is supplied from the top and bottom ends, in FIG. 12, of the ladder-shaped flexible board 18 toward the inner side, paths to supply electric power to light source chips 10 that are far from the top and bottom ends of the flexible board 18 are longer than paths to supply electric power to light source chips 10 that are close to the top and bottom ends.

In this case, when light source chips 10 that are far from the top and bottom ends of the flexible board 18, and light source chips 10 that are close to the top and bottom ends emit light simultaneously, sufficient electric power is not supplied to the light source chips 10 that are far from the top and bottom ends of the flexible board 18 instantaneously in some cases.

In view of this, by arranging the capacitors C near the light source chips 10 and causing the capacitors C to perform what is called assistance of electric power supply to the nearby light source chips 10, the likelihood that the light source chips 10 are not supplied with sufficient electric power instantaneously can be reduced.

Figure 23:
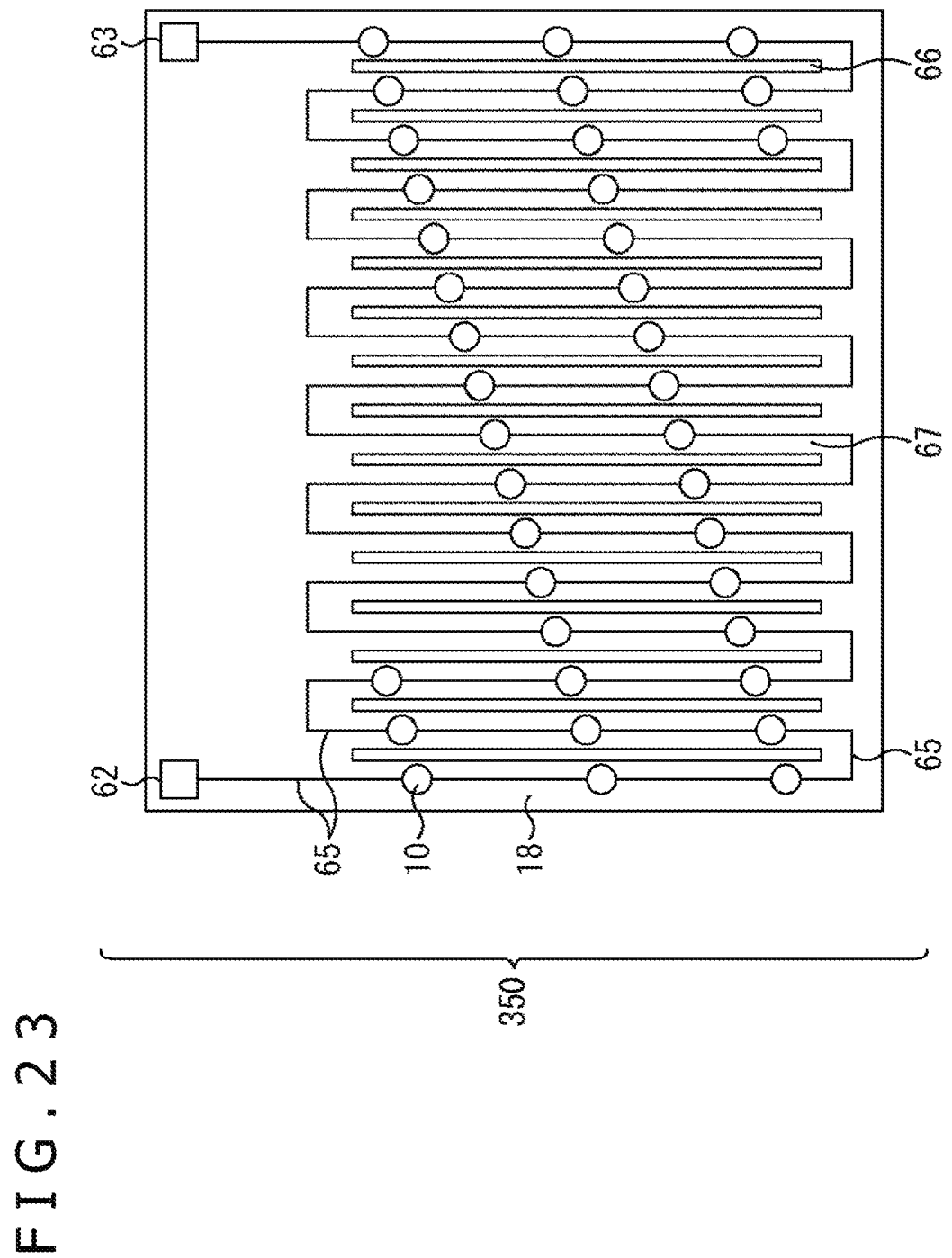
FIG. 23 is a plan view depicting a sixth configuration example of a light source module to which the light source chips 10 are applied.

FIG. 23 is a plan view depicting a sixth configuration example of a light source module to which the light source chips 10 are applied.

Note that portions in the figure that have counterparts in the light source module 60 in FIG. 12 are given identical reference characters, and explanations thereof are omitted as appropriate below.

In FIG. 23, a light source module 350 has a plurality of the light source chips 10, the flexible board 18, the control element 62, and the interface element 63.

The plurality of light source chips 10 is configured similarly to FIG. 1 and the like, and are connected in series in one line with the control element 62 (Control-IC) being connected at their starting point, and the interface element 63 (TransferJet-IC) being connected at their end point.

In the light source module 350, two or three light source chips 10 are arranged next to each other in the depthwise direction in one strip area 67. Furthermore, in the light source module 350, the light source chips 10 are arranged on the flexible board 18 such that the positions, in the depthwise direction, of the light source chips 10 relative to the flexible board 18 are shifted by a predetermined amount.

The control element 62 at the starting point receives data from a superordinate system, and, in accordance with the data, sends out trigger signals or light-emission-pattern data at constant intervals. For example, in a case that the operation time from light emission of the light source chips 10 to writing of history data is shorter than 0.5 ms, the control element 62 sends out trigger signals or light-emission-pattern data at intervals which are equal to or longer than 0.5 ms. The following light source chips 10 receive the trigger signals or light-emission-pattern data from the control element 62, sequentially start light emitting operation by what is called bucket brigade, and transmit packet data of various types of history obtained by the light emitting operation.

The interface element 63 at the end point receives the packet data from the light source chips 10 and transmits the packet data to the superordinate system. More specifically, the interface element 63 transmits, to a CPU of the superordinate system, the packet data as serial data received from the light source chips 10. There are no problems even if the transmission is performed wiredly or wirelessly, but wireless transfer is desirable. Standards of wireless transfer include, for example, TransferJet (registered trademark) and the like.

Note that the interface element 63 can have a functionality of receiving, from the light source chips 10, light emission timing history information (history data), error information and the like, and giving feedback about the operation situation to a superordinate system that separately performs overall control. It should be noted that this functionality can be omitted. The light source module 350 can cause the light source chips 10 to emit light in accordance completely open control.

Whereas the one flexible board 18 is provided with the connection wire 65 as one serial wire group in FIG. 23, a plurality of serial wire groups may be provided in parallel as the connection wire 65. In a case that a plurality of serial wire groups is provided as the connection wire 65, a plurality of control elements 62 to be connected with the plurality of serial wire groups, respectively, can be provided, and further a superordinate control element (a superordinate control IC) that distributes data to the plurality of control elements 62 can be provided.

Here, in a case that the light emission pattern in the light source module 350 is complicated or in a case that the number of the light source chips 10 is large in the order of several hundreds or several thousands, an enormous amount of data is transmitted from the superordinate system to the control element 62. In this case, communication between the superordinate system and the control element 62 may be performed not wirelessly but wiredly.

It should be noted that, in a case that communication between the superordinate system and the control element 62 is performed wiredly, when the light source module 350 is attached to and rotates relative to a base member, a rotary contact or the like that is not constrained by rotation is necessary in order to electrically connect the superordinate system and the control element 62.

If a rotary contact is used, noise is superimposed on data that goes through the rotary contact, and accurate data cannot be transmitted in some cases. In view of this, communication between the superordinate system and the control element 62 can be performed by contactless optical transfer. The optical transfer can be performed by providing an optical transfer path for sending pulsed light at a coaxial section between a rotation shaft and a fixed shaft for rotating the light source module 350 attached to the base member, and the like.

In addition, whereas data transmission can be performed by bucket brigade in the plurality of light source chips 10 connected in series, the manner of transmission is not limited to bucket brigade. Data transmission can be performed, for example, in an analog manner in the plurality of light source chips 10 connected in series. In addition, the configuration of data transmitted by the light source chips 10, and the form of connection between the plurality of light source chips 10 are not limited particularly.

Figure 24:
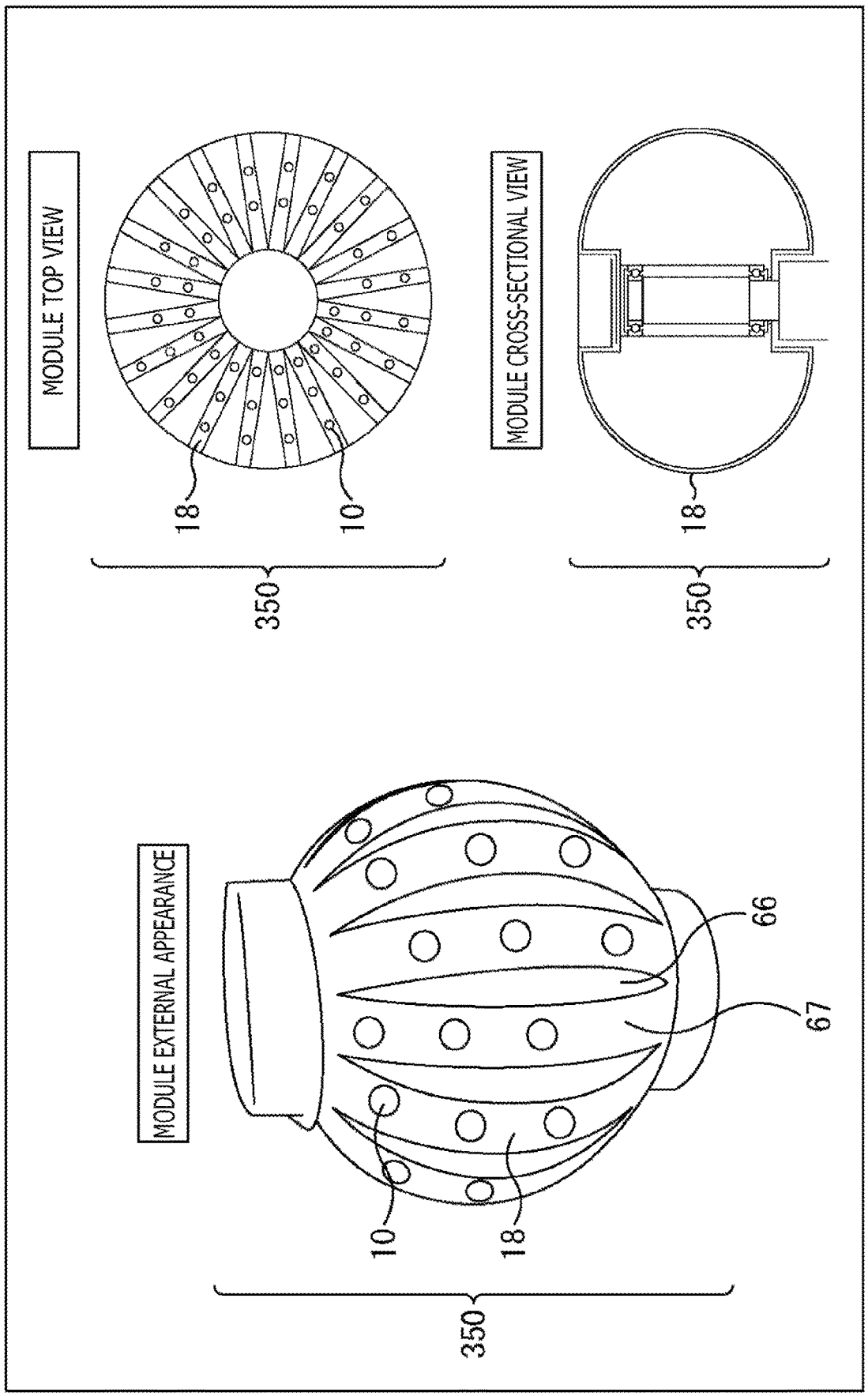
FIG. 24 is a figure depicting an assembly example of a light source module 350.

FIG. 24 is a figure depicting an assembly example of the light source module 350 in FIG. 23.

In FIG. 24, the light source module 350 is assembled into a lantern-type light source module.

In FIG. 24, the flexible board 18 is deformed such that the strip areas 67 having the plurality of light source chips 10 arranged therein as depicted in FIG. 23 form lines of longitude (meridians) of a ball (the earth), and thus the light source module 350 is configured in a shape like a slightly vertically-collapsed spherical lantern.

That is, in FIG. 24, by attaching the flexible board 18 of the light source module 350 onto a slightly vertically-collapsed spherical (approximately spherical) base member as if the flexible board 18 is wound around the base member, the approximately spherical light source module 350 whose strip areas 67 of the flexible board 18 form lines of longitude is configured.

The light source chips 10 are arranged on the flexible board 18 such that light emitted by the light-emitting boards 11 exit outward (in directions of perpendicular lines of the spherical surface). Note that, in FIG. 24, the control element 62, the interface element 63, and the connection wire 65 are not depicted to avoid complicated figures.

In the assembling process of assembling the light source module 350 into a lantern-type light source module, the flexible board 18 of the light source module 350 is pasted onto and fixed to a base member having a curved surface with a protruding shape, a spherical shape, or the like.

The positioning to be performed in a case that the flexible board 18 is pasted onto and fixed to the base member can be performed, for example, as fitting positioning in which holes are formed through the flexible board 18 and protrusions or the like are provided on the base member to fit the protrusions of the base member into the holes of the flexible board 18.

Other than this, the positioning may be positioning fixation in which holes are provided through both the flexible board 18 and the base member and pins for positioning are used. Thus, (the exiting directions of light of) the light source chips 10 can be aligned with directions vertical to the curved surface, and projection in directions relevant to the respective light source chips 10 becomes possible.

Major specifications of the light source module 350 such as light emission angles or resolution can be set freely by changing the mounting positions, pitch, or the like of the light source chips 10. The specifications can also be set such that light is caused to exit at high resolution in certain directions and light is caused to exit at low resolution in the other directions.

It should be noted that, because the number of light source chips 10 necessary for the light source module 350 is proportional to the resolution, for example, if it is attempted to give the light source module 350 high resolution equal to or lower than one degree, a large number of light source chips 10 are necessary.

For example, in a case that projection is performed omnidirectionally at resolution in the depthwise and widthwise directions of 0.1 degrees (in a case that light is to be caused to exit omnidirectionally), approximately 6.5 million (≈360/0.1×180/0.1) light source chips 10 are necessary.

In a case that such high resolution is necessary, a structure that rotates a base member is effective for cost reduction.

In this case, the light source chips 10 can be mounted, for example, at intervals of 10 degrees (360/10 points) in the H (Horizontal) direction (in the direction along the lines of latitude) and at intervals of 3.6 degrees (180/3.6 points) in the V (Vertical) direction (in the direction along the lines of longitude). Further, in the mounting of the light source chips 10, the mounting positions are offset at intervals of 0.1 degrees.

By attaching, to the base member, the light source module 350 having the light source chips 10 mounted thereon in the manner mentioned above, assembling the light source module 350 into a lantern-type light source module, and causing the light source module 350 to perform rotational scanning, the resolution of 0.1 degrees can be realized by a mere 1800 (=360/10×180/3.6) light source chips 10.

In a case that light emission control of causing light source chips 10 to emit light and not to emit light 3600 times (=360 degrees/0.1 degrees) per rotation, and it takes 5 μs to perform the light emission control once, light can be projected omnidirectionally at resolution of 0.1 degrees by performing one rotation in 0.018 s (=5 μs×3600 times).

For example, by causing the light source chips 10 included in the light source module 350 to emit R (Red), G (Green), and B (Blue) visible light as appropriate, an omnidirectional spherical projector that projects color images omnidirectionally can be realized.

In addition, for example, by causing the light source chips 10 included in the light source module 350 to emit infrared light with multiple types of wavelength such as three types of wavelength as appropriate, a rewritable full color paper can be realized by using a paper-like device that displays different colors in accordance with the wavelength of infrared light with which the device is irradiated.

Note that, for example, the light intensities can be changed in the light emission control of the light source chips 10. In addition, for example, PWM control can be performed in the light emission control of the light source chips 10.

Figure 25:
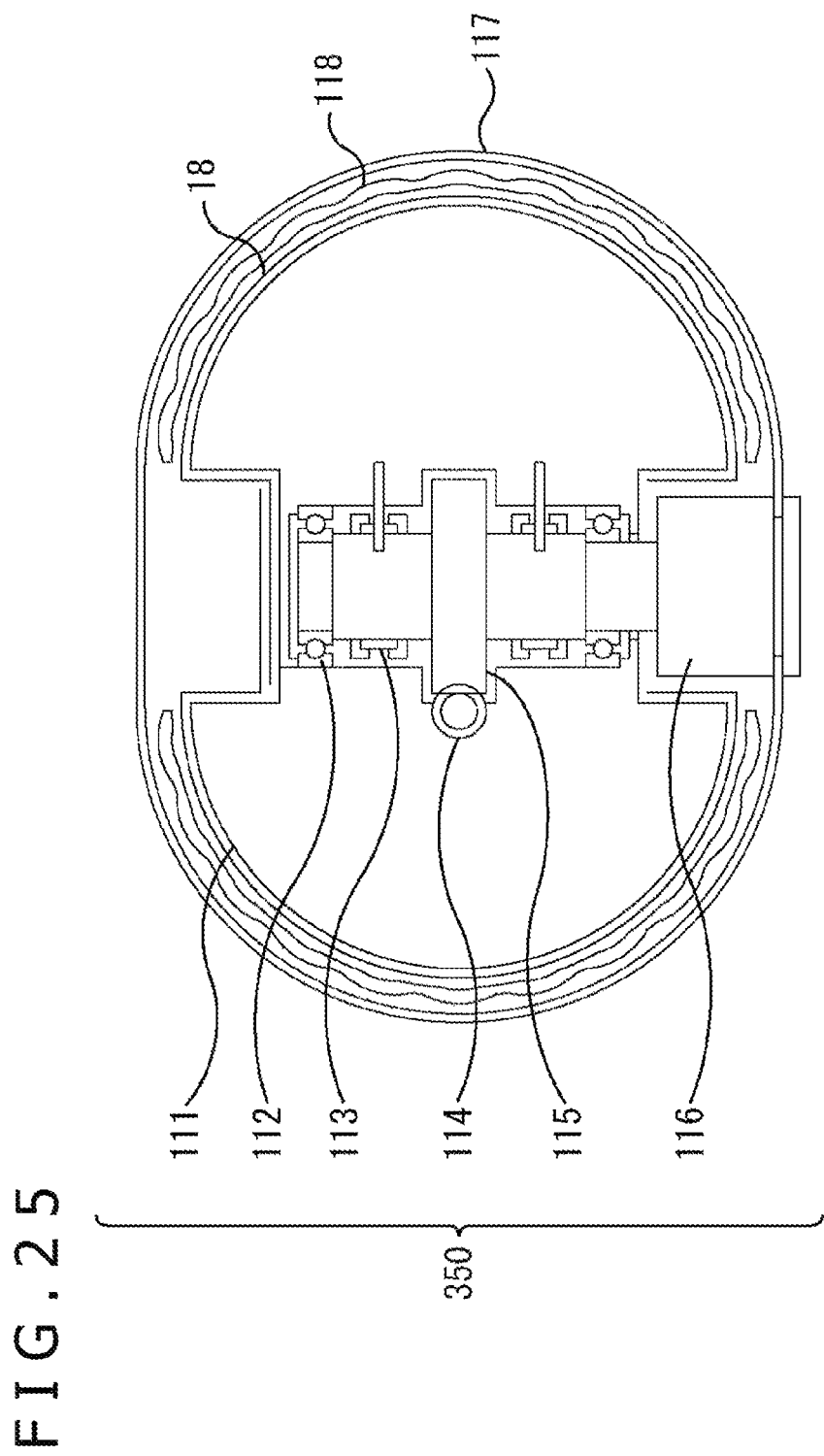
FIG. 25 is a cross-sectional view depicting a configuration example of the light source module 350 assembled into a lantern-type light source module.

FIG. 25 is a cross-sectional view depicting a configuration example of the light source module 350 assembled into a lantern-type light source module.

In FIG. 25, the light source module 350 includes a flexible base (base member) 111, a main bearing 112, a rotary contact 113, a micro DC motor 114, a main gear 115, a main shaft 116, a transparent cover 117, a lens array 118, and the like.

The flexible board 18 provided with light source chips 10 (not depicted in FIG. 25) is attached onto the light source module 350 such that the light source chips 10 form lines of longitude along the outer surface of the slightly vertically-collapsed spherical flexible base 111.

The micro DC motor 114 fits to the main gear 115. In accordance with driving of the micro DC motor 114, torque is transferred to the main gear 115, the main shaft 116 fits to the main gear 115, the main gear 115 and components including the flexible board 18 of the light source module 350 other than the transparent cover 117 rotate about the main shaft 116. That is, while the micro DC motor 114 is generating rotational torque, the micro DC motor 114 itself also rotates about the main shaft 116 integrally with other components. Similarly to a lens array 372 to be mentioned later, the lens array 118 is included in a dual-lens structure to be mentioned later.

Note that the drive section (means) that rotation-drives the light source module 350 is not limited to the micro DC motor 114, but may be any motor as long as the drive section is a motor such as a frameless motor that generates torque.

The rotation structure of the light source module 350 may use typical bearings. Electrical power supply may be performed by a typical electrical power supply method that uses a brush or the like or a contactless coil manner. The positional and phase detection of a rotational base member such as the flexible base 111 may be performed by using a typical hole element or the like. Data transmission in light emission control or the like to the light source module 350 may be performed by wired transfer by using electrodes or the like or by optical transfer, but may be performed by wireless transfer by TransferJet (registered trademark) or the like.

The light-emitting board 11 as a light source and the lens 15 (and/or the lens array 201, 211, or 221) as an optical part in the light source chips 10 can be integrated together at a chip level, and therefore it is not necessary to perform positioning of them. That is, according to the light source chips 10, a light source chip having the light-emitting element 21, the lens 15, and the like that are integrated together, and further a light source module to which such light source chips are applied can be provided with simple structures. Therefore, a small-sized, lightweight, and inexpensive apparatus that does not require maintenance can be realized.

Note that the light source module 350 assembled into a lantern-type light source module can perform, for example, scanning with combined patterns of motion such as reciprocal oscillating scanning or two-dimensional oscillating and rotational scanning, other than rotational scanning.

Figure 26:
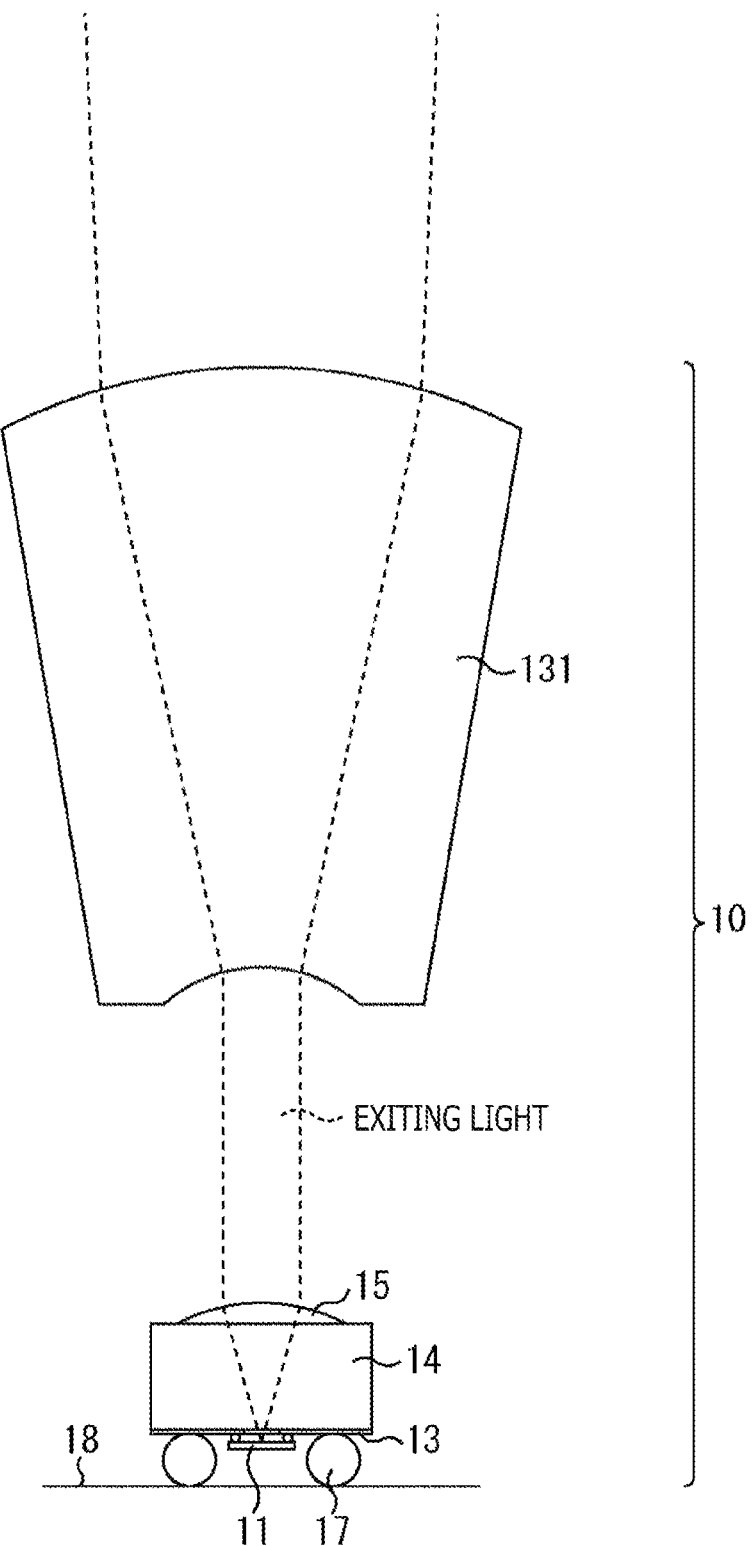
FIG. 26 is a cross-sectional view depicting a seventh configuration example of the light source chip to which the present technology is applied.

FIG. 26 is a cross-sectional view depicting a seventh configuration example of the light source chip to which the present technology is applied.

Note that portions in the figure that have counterparts in the case of FIG. 4 are given identical reference characters, and explanations thereof are omitted as appropriate below.

Here, in order for the light source chip 10 to realize longer-distance irradiation of light, it is effective to increase the distance between the light-emitting board 11 and the lens 15.

However, in a case that the lens 15 is formed at semiconductor steps, if the distance between the light-emitting board 11 and the lens 15 is increased, the size of the lens 15 and consequently the chip size of the light source chip 10 increase, and the costs of the light source chip 10 increase significantly.

In view of this, FIG. 26 depicts a configuration example of the light source chip 10 with a dual-lens structure.

By adopting a dual-lens structure in the light source chip 10, longer-distance irradiation of light can be realized while cost increases of the light source chip 10 are kept small.

In FIG. 26, an inexpensive resin molded lens 131 is arranged above the light source chip 10, and thus the light source chip 10 has a dual-lens structure having the resin molded lens 131 in addition to the lens 15. Note that the light source chip 10 can be provided with one or more lenses in addition to the lens 15 and the resin molded lens 131.

It is supposed that the diameter of the resin molded lens 131 is, for example, α 3.8 mm which is approximately twice as large as the circuit board 13. The lens 15 (one lens) and the resin molded lens 131 (another lens) are collimate-coupled by collimated light of φ 1.2 mm, for example. Thus, for example, even if (optical) axial misalignment of ±0.2 mm occurs between the lens 15 and the resin molded lens 131, stable collimated light can be formed almost without deterioration of the coupling efficiency.

For example, in a case that the light source chip 10 in FIG. 26 is to be applied to the light source module 350 to be assembled into a lantern-type light source module, a transparent cover is placed on to seal outermost sections such that the lens 15 and the resin molded lens 131 are covered completely. In a case that the light source chip 10 in FIG. 26 is applied to a light source module, like the light source module 350 to be assembled into a lantern-type light source module, from which light is caused to exit omnidirectionally, a seamless transparent cover is necessary.

Figure 28:
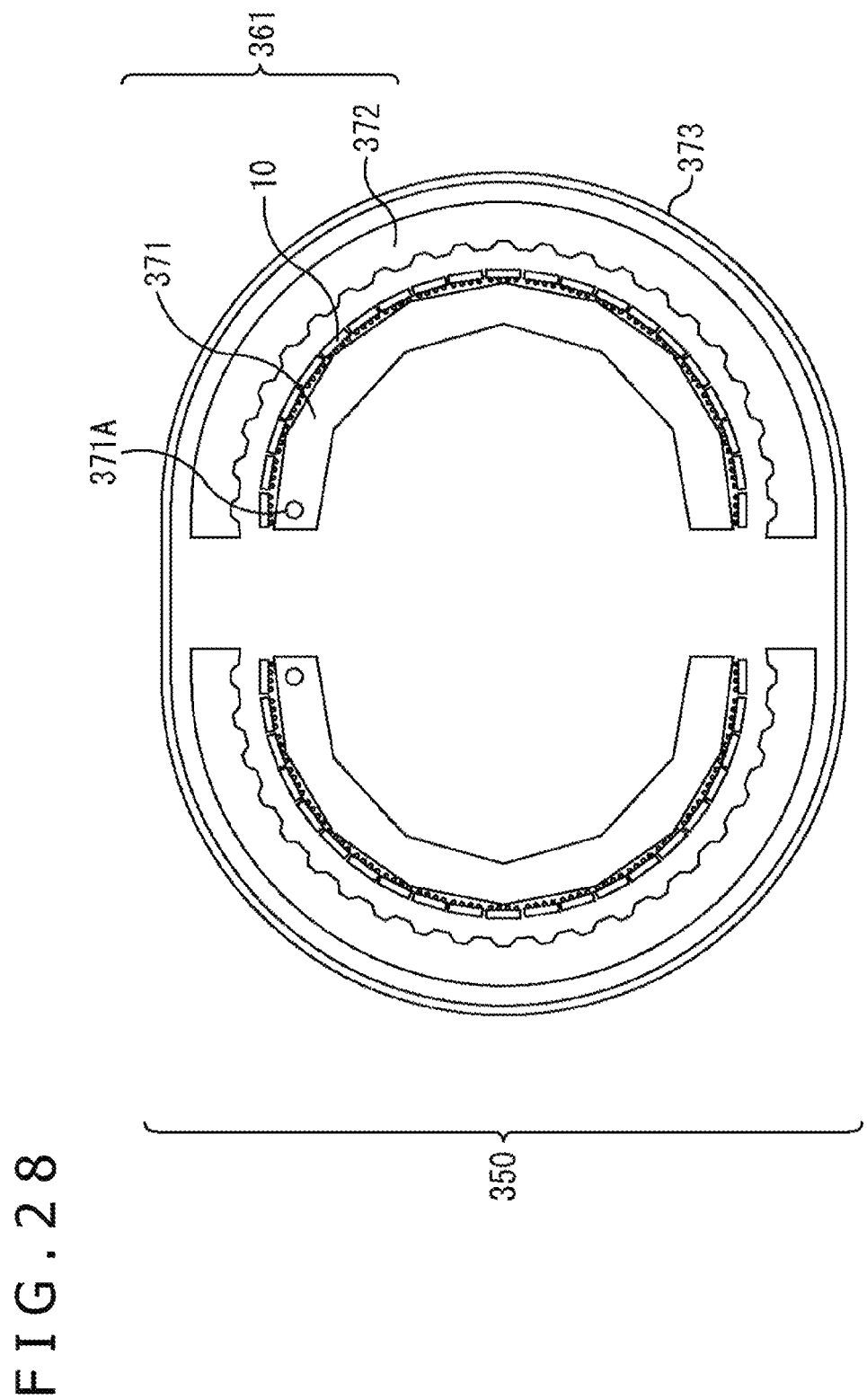
FIG. 28 is a cross-sectional view depicting the seventh configuration example of the light source module to which the light source chips 10 are applied.

FIG. 27 is a perspective view depicting an overview of a seventh configuration example of a light source module to which the light source chips 10 are applied, and FIG. 28 is a cross-sectional view depicting the seventh configuration example of the light source module.

A light source module 360 is configured, for example, by arranging four semi-arc-like outer rib sections 361 such that the outer rib sections 361 form a spherical surface.

The four arc-like outer rib sections 361 are arranged in the light source module 360 such that the angles therebetween are 90 degrees, and can be opened and closed as depicted in FIG. 27 like outer ribs of an umbrella, with ends of the outer rib sections 361 on one side as fulcrums.

As depicted in FIG. 28, the light source module 360 can be configured by attaching the thin rectangular flexible board 18 having the light source chips 10 mounted thereon to base members 371 which have shapes like the frame of an umbrella and serve as the outer rib sections 361.

An outer rib section 361 is configured by attaching the thin rectangular flexible board 18 having the light source chips 10 mounted thereon to an arc-like base member 371, and further arranging a lens array 372 included in a dual-lens structure above the light source chips 10 (such that the lens array 372 is located in directions in which light is caused to exit). A transparent cover 373 is arranged in a state that the cover 373 is separately fixed above the lens array 372.

The outer rib sections 361 pivot (are opened and closed) with their ends 371A of the arc-like shapes on one side as fulcrums.

The light source module 360 can be configured by mounting 30 (=180/6) light source chips 10 at intervals of 6 degrees in the V direction of the respective base members 371 of the four outer rib sections 361 that form 90 degrees as mentioned above and further offsetting the mounting positions of the light source chips 10 at intervals of 1.5 degrees for each outer rib section 361.

Then, by causing the light source module 360 to perform rotational scanning and changing the angles of the outer rib sections 361 by 0.1 degrees per rotation, light can be caused to exit omnidirectionally at resolution of 0.1 degrees with 120 (=4×30) light source chips 10.

In a case that light emission control of the light source chips 10 is performed 3600 times (=360 degrees/0.1 degrees) per rotation, and it takes 5 μs to perform the light emission control once, one rotation is performed in 0.018 s (=5 μs×3600 times). In this case, light can be projected omnidirectionally at resolution of 0.1 degrees by 15 rotations (=1.5/0.1).

Note that opening and closing of the outer rib sections 361 can be realized by a typical link mechanism.

In addition, for example, in order to maintain sharp collimated light to a distant location which is at a distance of 100 m or longer or the like, for example, it is effective to keep the distance between the light-emitting board 11 and the lens 15 at, for example, 10 mm or longer in the light source chip 10 in FIG. 4. In addition, it is effective to temporarily make light that exits from the light-emitting board 11 large by increasing the lens diameter of the lens 15, and generate collimated light therefrom or slightly reduce the diameter of the light. For this purpose, it is effective to further provide one or more lenses above the lens 15 as in the dual-lens structure in FIG. 26.

In view of this, regarding the light source module 350 to be assembled into a lantern-type light source module and the light source module 360 configured by using the base members 371 having a shape like the frame of an umbrella, for example, a lens can be fabricated with a material which is transparent to exiting light of the light source chips 10, for example, an injection-molded resin or the like, for a dome-like structure, and the lens can be arranged above each of the plurality of light source chips 10. Alternatively, a dome-like lens array having a lens to be arranged above each of the plurality of light source chips 10 can be fabricated at once by injection molding, and can be arranged to entirely cover all of the light source chips 10. The lens array 372 includes such a lens array.

In a case that the dome-like lens array is arranged above the plurality of light source chips 10, it is difficult to align each of the optical axes of the lenses of the lens array and a corresponding one of the optical axes of the plurality of light source chips 10 with accuracy of, for example, ±50 μm or smaller. In view of this, in one possible optical design that can be adopted, the light source chips 10 and the lens array are collimate-coupled by collimated light, and for example even if optical axial misalignment of approximately ±100 μm has occurred, the coupling loss can be kept at or lower than 1 dB, for example.

As mentioned above, the present technology can provide the light source chips 10 that are widely applicable to distance measurement modules that perform distance measurement, light source modules that cause light to exit omnidirectionally and project images, light sources for rewritable full color papers, and various other apparatuses.

Note that embodiments of the present technology are not limited to the embodiments mentioned above, but can be changed in various manners within the scope not deviating from the gist of the present technology.

In addition, advantages described in the present specification are mentioned merely for illustrative purposes, and are not the sole advantages. There may be other advantages.

Note that the present technology can have the following configurations.

<1>
A light source apparatus including:
a transmissive board that transmits light emitted by a light-emitting element;
a circuit board that drives the light-emitting element and is joined to the transmissive board; and
a light-emitting board that has the light-emitting element and is connected to the circuit board via a first bump, in which
the circuit board and an organic board are configured to be connected by sandwiching the light-emitting board via a second bump.

<2>
The light source apparatus according to <1>, further including:
the organic board.

<3>
The light source apparatus according to <2>, in which the light-emitting board has one or a plurality of light-emitting points <4>
The light source apparatus according to <2> or <3>, in which the circuit board has an opening at a portion corresponding to the light-emitting element.

<5>
The light source apparatus according to <4>, further including:
a lens through which light emitted by the light-emitting element passes, in which
an optical axis of the lens, an optical axis of the light-emitting element, and a central axis of the opening are arranged approximately coaxially.

<6>
The light source apparatus according to <5>, in which the lens is provided on one of or both a light-emitting-board side of the transmissive board on which side the light-emitting board is provided and a side opposite to the light-emitting-board side.

<7>
The light source apparatus according to <6>, in which the lens is provided on the light-emitting-board side of the transmissive board such that a space is formed between the light-emitting element and the lens.

<8>
The light source apparatus according to <7>, in which the lens is provided for each light-emitting point of the light-emitting board.

<9>
The light source apparatus according to any one of <2> to <8>, further including:
a heat dissipating body formed between the light-emitting board and the organic board.

<10>
The light source apparatus according to <9>, in which the heat dissipating body is solder having a melting point lower than melting points of the first bump and the second bump.

<11>
The light source apparatus according to any one of <2> to <10>, in which the second bump has therein a core body.

<12>
The light source apparatus according to any one of <2> to <11>, in which a filler material seals a space between the circuit board and the organic board.

<13>
The light source apparatus according to any one of <2> to <12>, in which the organic board is formed in a ladder shape, a zigzag shape, or a swirl shape.

<14>
The light source apparatus according to any one of <2> to <13>, further including:
a reinforcing material that supports the organic board.

<15>
The light source apparatus according to any one of <2> to <14>, further including:
a base member to which the organic board is attached.

<16>
The light source apparatus according to <15>, in which the base member has a curved surface having steps formed thereon, and
the organic board is attached to the curved surface.

<17>

The light source apparatus according to <15> or <16>, further including:
 a cooling mechanism.

<18>

The light source apparatus according to any one of <2> to <17>, in which a light source chip including the transmissive board, the circuit board, and the light-emitting board is arranged around a light-receiving element.

<19>

The light source apparatus according to claim <18>, in which the light source chip and the light-receiving element are arranged on one board.

<20>

The light source apparatus according to any one of <2> to <19>, in which
 a plurality of light source chips each including the transmissive board, the circuit board, and the light-emitting board is arranged on the organic board, and
 simultaneous emission of adjacent light source chips is limited.

<21>

The light source apparatus according to any one of <2> to <20>, further including:
 a capacitor that connects an electric power supply line and a GND line of a light source chip including the transmissive board, the circuit board, and the light-emitting board.

<22>

The light source apparatus according to <5>, including:
 a plurality of lenses through which light emitted by the light-emitting element passes.

<23>

The light source apparatus according to <22>, in which one lens and another lens of the plurality of lenses are configured such that collimated light couples the one lens and the other lens.

REFERENCE SIGNS LIST

10: Light source chip
11: Light-emitting board
13: Circuit board
14: Transmissive board
15: Lens
17: Second bump
18: Flexible board
21: Light-emitting element
31: First bump
41: Opening
60: Light source module
62: Control element
63: Interface element
65: Connection wire
66: Slit
67: Strip area
70: Light source module
71: Slit
80, 90: Light source module
91: Reinforcing material
111: Flexible base
112: Main bearing
113: Rotary contact
114: Micro DC motor
115: Main gear
116: Main shaft
117: Transparent cover
131: Resin molded lens
201, 211, 221: Lens array
231: Heat dissipating body
241: Core body
251: Under-filler material
310: Distance measurement module
311: Substrate
312, 313: Base member
314: Light-receiving section
321: Cooling mechanism
330, 340, 350, 360: Light source module
361: Outer rib section
371: Base member
372: Lens array
373: Cover

The invention claimed is:

1. A light source apparatus comprising:
 a transmissive board that transmits light emitted by a light-emitting element;
 a circuit board that drives the light-emitting element and is joined to the transmissive board; and
 a light-emitting board that has the light-emitting element and is connected to the circuit board via a first bump, wherein
 the circuit board and an organic board are configured to be connected by sandwiching the light-emitting board via a second bump.

2. The light source apparatus according to claim 1, further comprising:
 the organic board.

3. The light source apparatus according to claim 2, wherein the light-emitting board has one or a plurality of light-emitting points.

4. The light source apparatus according to claim 2, wherein the circuit board has an opening at a portion corresponding to the light-emitting element.

5. The light source apparatus according to claim 4, further comprising:
 a lens through which light emitted by the light-emitting element passes, wherein
 an optical axis of the lens, an optical axis of the light-emitting element, and a central axis of the opening are arranged approximately coaxially.

6. The light source apparatus according to claim 5, wherein the lens is provided on one of or both a light-emitting-board side of the transmissive board on which side the light-emitting board is provided and a side opposite to the light-emitting-board side.

7. The light source apparatus according to claim 6, wherein the lens is provided on the light-emitting-board side of the transmissive board such that a space is formed between the light-emitting element and the lens.

8. The light source apparatus according to claim 7, wherein the lens is provided for each light-emitting point of the light-emitting board.

9. The light source apparatus according to claim 5, comprising:
 a plurality of lenses through which light emitted by the light-emitting element passes.

10. The light source apparatus according to claim 9, wherein one lens and another lens of the plurality of lenses are configured such that collimated light couples the one lens and the other lens.

11. The light source apparatus according to claim 2, further comprising:
 a heat dissipating body formed between the light-emitting board and the organic board.

12. The light source apparatus according to claim 11, wherein the heat dissipating body is solder having a melting point lower than melting points of the first bump and the second bump.

13. The light source apparatus according to claim 2, wherein the second bump has therein a core body.

14. The light source apparatus according to claim 2, wherein a filler material seals a space between the circuit board and the organic board.

15. The light source apparatus according to claim 2, wherein the organic board is formed in a ladder shape, a zigzag shape, or a swirl shape.

16. The light source apparatus according to claim 2, further comprising:
   a reinforcing material that supports the organic board.

17. The light source apparatus according to claim 2, further comprising:
   a base member to which the organic board is attached.

18. The light source apparatus according to claim 17, wherein
   the base member has a curved surface having steps formed thereon, and
   the organic board is attached to the curved surface.

19. The light source apparatus according to claim 17, further comprising:
   a cooling mechanism.

20. The light source apparatus according to claim 2, wherein a light source chip including the transmissive board, the circuit board, and the light-emitting board is arranged around a light-receiving element.

21. The light source apparatus according to claim 20, wherein the light source chip and the light-receiving element are arranged on one board.

22. The light source apparatus according to claim 2, wherein
   a plurality of light source chips each including the transmissive board, the circuit board, and the light-emitting board is arranged on the organic board, and
   simultaneous emission of adjacent light source chips is limited.

23. The light source apparatus according to claim 2, further comprising:
   a capacitor that connects an electric power supply line and a GND line of a light source chip including the transmissive board, the circuit board, and the light-emitting board.

* * * * *